(12) United States Patent
Baek et al.

(10) Patent No.: US 10,777,270 B2
(45) Date of Patent: Sep. 15, 2020

(54) METHODS AND SYSTEMS FOR COMPENSATING FOR DEGRADATION OF RESISTIVE MEMORY DEVICE

(71) Applicant: Samsung Electronics Co., Ltd., Suwon-si, Gyeonggi-do (KR)

(72) Inventors: Seung-you Baek, Suwon-si (KR); Han-sung Joo, Seoul (KR); Ki-sung Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/377,952

(22) Filed: Apr. 8, 2019

(65) Prior Publication Data

US 2020/0051629 A1    Feb. 13, 2020

(30) Foreign Application Priority Data

Aug. 7, 2018    (KR) .................. 10-2018-0092049

(51) Int. Cl.
*G11C 11/00* (2006.01)
*G11C 13/00* (2006.01)
(Continued)

(52) U.S. Cl.
CPC ...... *G11C 13/0035* (2013.01); *G11C 11/1673* (2013.01); *G11C 11/1675* (2013.01);
(Continued)

(58) Field of Classification Search
CPC ............. G11C 13/0069; G11C 13/004; G11C 11/1673; G11C 13/0002; G11C 13/0004; G11C 11/1659; G11C 13/0007; G11C 11/1675; G11C 13/0033; G11C 29/52; G11C 13/0035
(Continued)

(56) References Cited

U.S. PATENT DOCUMENTS 7,542,357 B2    6/2009 Sakata et al.
7,679,954 B2    3/2010 Lee et al.
(Continued)

FOREIGN PATENT DOCUMENTS

JP          4545726 B2    9/2010
KR   10-2011-0078727 A    7/2011
(Continued)

*Primary Examiner* — Thong Q Le
(74) *Attorney, Agent, or Firm* — Harness, Dickey & Pierce, P.L.C.

(57) ABSTRACT

A memory controller may control a resistive memory device including memory cells may control the resistive memory device to program the memory cells into a first resistance state, control the resistive memory device to read data from the memory cells that are programmed, receive bit error rates (BER) of the memory cells, occurring in a read operation, from the resistive memory device, may determine the number of program operations on the memory cells corresponding to the BER and may, based on the number of program operations that is determined, control the memory cells to be programmed into the first resistance state by using a write current having a current level higher than that of a minimum write current required for the memory cells to be changed into the first resistance state.

27 Claims, 15 Drawing Sheets

(51) Int. Cl.
*G11C 11/16* (2006.01)
*G11C 11/56* (2006.01)
*H01L 45/00* (2006.01)

(52) U.S. Cl.
CPC ...... *G11C 11/5607* (2013.01); *G11C 11/5678* (2013.01); *G11C 11/5685* (2013.01); *G11C 13/004* (2013.01); *G11C 13/0004* (2013.01); *G11C 13/0007* (2013.01); *G11C 13/0069* (2013.01); *G11C 13/0097* (2013.01); *G11C 2013/0078* (2013.01); *G11C 2211/5644* (2013.01); *G11C 2213/32* (2013.01); *G11C 2213/52* (2013.01); *H01L 45/1233* (2013.01); *H01L 45/1253* (2013.01); *H01L 45/144* (2013.01); *H01L 45/146* (2013.01)

(58) Field of Classification Search
USPC ............... 365/148, 158, 163, 171, 154, 156, 365/185.09, 189.011, 189.05, 189.15, 365/206, 207, 211, 227, 230.03, 94
See application file for complete search history.

(56) References Cited

U.S. PATENT DOCUMENTS

| | | | |
|---|---|---|---|
| 7,990,790 | B2 | 8/2011 | Lee |
| 8,213,254 | B2 | 7/2012 | Choi et al. |
| 8,413,004 | B2 | 4/2013 | Franceschini et al. |
| 8,588,010 | B2 | 11/2013 | Lee et al. |
| 8,634,225 | B2 | 1/2014 | Kang |
| 9,021,227 | B2 | 4/2015 | Karpov et al. |
| 9,164,836 | B2 | 10/2015 | Guo et al. |
| 9,196,380 | B2 | 11/2015 | Liu et al. |
| 9,263,136 | B1 | 2/2016 | Zhao et al. |
| 9,396,118 | B2 | 7/2016 | Dong |
| 2012/0290781 | A1 | 11/2012 | Seo et al. |
| 2016/0172034 | A1* | 6/2016 | Oh ........................ H03M 13/27 365/148 |

FOREIGN PATENT DOCUMENTS

| | | |
|---|---|---|
| KR | 101071705 B1 | 10/2011 |
| KR | 101780539 B1 | 9/2017 |

* cited by examiner

METHODS AND SYSTEMS FOR COMPENSATING FOR DEGRADATION OF RESISTIVE MEMORY DEVICE

CROSS-REFERENCE TO RELATED APPLICATION

This application claims the benefit, under 35 U.S.C. § 119, of Korean Patent Application No. 10-2018-0092049, filed on Aug. 7, 2018, in the Korean Intellectual Property Office, the disclosure of which is incorporated herein in its entirety by reference.

BACKGROUND

The inventive concepts relate to non-volatile memory devices, and more particularly, to methods of compensating for degradation of resistive memory devices.

Resistive memory devices such as phase change RAM (PRAM), resistive RAM (RRAM), and magnetic RAM (MRAM) are known as non-volatile memory devices. In such resistive memory devices, variable resistance devices, which store data according to changes in the condition of resistances, are used as memory cells. Resistive memory devices include cross-point type resistive memory devices. A cross-point type resistive memory device may be formed by placing the memory cells of the memory device at cross-points at which a plurality of bit lines and a plurality of word lines cross one another. A resistive memory device may access a memory cell therein by applying a voltage to two opposite terminals of the memory cell, and the accessed memory cell may store a logic "1 (set data)" (a low-resistance state) or a logic "0 (reset data)" (a high-resistance state) with reference to a threshold resistance of the memory cell.

A criterion in the resistive memory device is a retention time at which data may be preserved and an endurance level at which a normal operation may be performed without being worn out when writing data. Data retention and endurance of the resistive memory device may be dependent on circumstances that deteriorate characteristics of memory cells, for example, a high temperature and/or the number of program times. Due to degradation of the memory cells, a sensing margin between the set data of logic "1" and the reset data of logic "0" may decrease. Therefore, timing overhead, which means sensing of the set data or the reset data becomes less reliable or slower, or a plurality of bit errors may be caused. Degradation of the resistive memory device results in decrease in the capacity of a storage device including the resistive memory device.

SUMMARY

The inventive concepts provide methods and systems for compensating degradation of resistive memory devices.

According to some example embodiments of the inventive concepts, a method of operating a memory controller, the memory controller configured to control a resistive memory device, the resistive memory device including a plurality of memory cells, may include controlling the resistive memory device to program the plurality of memory cells into a first resistance state, controlling the resistive memory device to perform a read operation on the plurality of memory cells that are programmed into the first resistance state, receiving, from the resistive memory device, an indicator that indicates a degree of degradation of the plurality of memory cells, and controlling, based on the indicator that indicates the degree of degradation, the plurality of memory cells to be programmed into the first resistance state based on using a write current that has a current level greater than a current level of a minimum write current that is necessary for the plurality of memory cells to be programmed into the first resistance state.

According to some example embodiments of the inventive concepts, a resistive memory device may include a memory cell array including a plurality of memory cells, a write circuit configured to perform a write operation, by using a write current according to a control voltage, to program the plurality of memory cells into a first resistance state, a read circuit configured to perform a read operation to read data from the plurality of memory cells that are programmed into the first resistance state, and a control circuit configured to count bit error rates (BER) of the plurality of memory cells that occur in the read operation and output the BER to an outside of the resistive memory device. The control circuit may be configured to, in response to a control signal that is received from the outside of the resistive memory device based on the BER, control the control voltage such that the write current is increased to have a current level that is greater than a current level of a minimum write current necessary for the plurality of memory cells to be changed into the first resistance state.

According to some example embodiments of the inventive concepts, a memory system may include a resistive memory device and a memory controller. The resistive memory device may include a memory cell array including a plurality of memory cells, a write circuit configured to perform a write operation, by using a write current according to a control voltage, to program the plurality of memory cells into a first resistance state, a read circuit configured to perform a read operation to read data from the plurality of memory cells that are programmed into the first resistance state, and a control circuit configured to count bit error rates (BER) of the plurality of memory cells that occur in the read operation and output the BER. The memory controller may be configured to control the resistive memory device. The control circuit of the resistive memory device may be configured to output the BER to the memory controller. The memory controller may be configured to determine a quantity of program operations on the plurality of memory cells corresponding to the BER and control, based on the quantity of program operations on the plurality of memory cells that is determined, the write operation such that the write current is increased to have a current level that is greater than a current level of a minimum write current necessary for the plurality of memory cells to be changed into the first resistance state.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
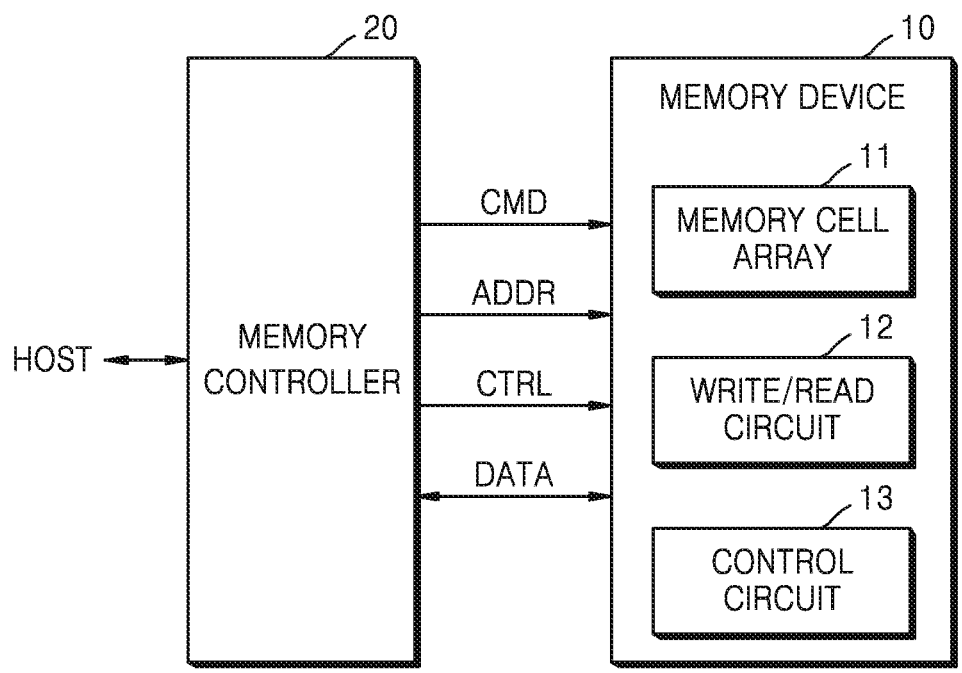
FIG. 1 is a block diagram for describing a memory system according to some example embodiments.

FIG. 1 is a block diagram of a memory system 1 according to some example embodiments. The memory system 1 may be included in an electronic device, a computing device, or the like.

Referring to FIG. 1, the memory system 1 may include a memory device 10 and a memory controller 20. The memory controller 20 may be implemented by one or more instances of circuitry, including an instance of processing circuitry (e.g., a processor device). The memory device 10 may include a memory cell array 11, a write/read circuit 12, and a control circuit 13. It will be understood that the memory device 10 as described herein may be a resistive memory device.

The memory controller 20 may, in response to a read/write request from a host, control the memory device 10 to read data from the memory device 10 or write data to the memory device 10. The memory controller 20 may, by providing an address ADDR, a command CMD, and a control signal CTRL to the memory device 10, control program (e.g., write) and read operations with respect to the memory device 10. In addition, data DATA for the program operation and data DATA that is read from the memory device 10 may be transmitted and received between the memory controller 20 and the memory device 10.

Although it is not shown, the memory controller 20 may include random access memory (RAM), a processing unit, a host interface, and a memory interface. The RAM may be used as an operation memory of the processing unit, and the processing unit may control operations of the memory controller 20. The host interface may include protocols which are used for data exchange between the host and the memory controller 20. For example, the memory controller 20 may be configured to communicate with the host via at least one of various protocols such as a universal serial bus (USB), a multi-media card (MMC), Peripheral Component Interconnect Express (PCI-E), Advanced Technology Attachment (ATA), Serial-ATA, Parallel-ATA, Small Computer Small Interface (SCSI), Enhanced Small Disk Interface (ESDI), and Integrated Drive Electronics (IDE).

The memory cell array 11 may include a plurality of memory cells that are respectively placed in regions at which a plurality of first signal lines and a plurality of second signal lines cross one another. In some example embodiments, the plurality of first signal lines may be a plurality of bit lines, and the plurality of second signal lines may be a plurality of word lines. In some example embodiments, the plurality of first signal lines may be a plurality of word lines, and the plurality of second signal lines may be a plurality of bit lines. In some example embodiments, the memory cells of the memory cell array 11 include one or more multi-level cells. In some example embodiments, the memory cells of the memory cell array 11 include one or more single-level cells.

In some example embodiments, the plurality of memory cells may include resistive memory cells, each including a variable resistance device having a variable resistance, or resistive memory cells. For example, when the variable resistance device includes a phase change material, for example, Ge—Sb—Te (GST), and changes resistance according to temperatures, the memory device 10 may be phase-change memory (PRAM). As another example, when the variable resistance device includes an upper electrode, a lower electrode, and a complex metal oxide therebetween, the memory device 10 may be resistive random access memory (RRAM). As yet another example, when the variable resistance device includes a magnetic upper electrode, a magnetic lower electrode, and a dielectric material therebetween, the memory device 10 may be magnetoresistive random access memory (MRAM).

The write/read circuit 12 may perform the write operation and the read operation on the memory cells. The write/read circuit 12 may repeatedly program the memory cells into a same data state and read data from the memory cells that are programmed into the same data state. The write/read circuit 12 may perform a program operation by applying minimal current, which is required for a phase change layer of the memory cells to cause phase change, to the memory cells, and may, by using a plurality of read voltages, perform the read operation to read data from the memory cells that are programmed. Alternatively, the write/read circuit 12 may perform a program operation by applying a plurality of write currents including a minimal current, which is required for the phase change layer of the memory cells to cause the phase change, to the memory cells, and a read operation to read data from the programmed memory cells.

The control circuit 13 may count bit error rates (BER) of the memory cells occurring in the read operation, the number of on-cells, and the number of off-cells. The control circuit 13 may provide the BER, the number of on-cells, and the number of off-cells to an outside of the memory device 10, for example to the memory controller 20. The control circuit 13 may provide data regarding BER, the number of on-cells, and the number of off-cells according to the plurality of write currents and/or data regarding BER according to the plurality of read voltages, the number of on-cells, and the number-of off-cells to the memory controller 20. Data regarding the BER, the number of on-cells, and the number of off-cells may be used as indicators to indicate the degree of degradation of the memory cells. Data regarding the BER, the number of on-cells, and the number of off-cells may be values generated from the read operation that is previously performed. The read operation may include an ordinary read operation and a dummy read operation, and a read voltage level in the ordinary read operation and a voltage level in the dummy read operation may be set to be different from each other.

Configurations of detecting a degree of degradation of one or more memory cells of memory device 10, which may be a resistive memory device, are described in detail in U.S. application Ser. No. 16/377,420, filed Apr. 8, 2019 and published as U.S. Pub. No. 2020/0051628 on Feb. 13, 2020, the entire contents of which are herein incorporated by reference in their entirety.

According to some example embodiments, the control circuit 13 may count the number ("quantity") of program operations performed in the memory cell array 11, for example the number of program operations on the memory cells in a particular resistance state. The control circuit 13 may provide ("output") the number of program operations performed in the memory cell array 11 to an outside of the memory device 10, for example to the memory controller 20.

In some example embodiments, the number of program operations on the memory cells that correspond to bit error rates (BER) occurring in a read operation on the memory cells may be an indicator that indicates a degree of degradation of the memory cells. In some example embodiments, the number of program operations to program the memory cells into a particular resistance state may be an indicator that indicates a degree of degradation of the memory cells. The memory controller 20 may, based on BER and/or the number of program operations received from the memory device 10, sense the degree of degradation of the memory device 10 and compensate for the degradation of the memory device 10. To compensate for the degradation of the memory device 10, the memory controller 20 may control the write operation by increasing the write current, which is applied to the memory cells, to have a current level that is higher than a current level of a minimum current that is required for the phase change layer of the memory cells to cause phase change. The memory controller 20 may change the current level of the write current, based on data regarding BER, the number of on-cells, the number of off-cells, or the number of program times. For example, the memory controller 20 may control a write current in a case where the number of program times is equal to or greater than a certain value is more strongly applied to the memory cell than a write current in a case where the number of program times is equal to or less than the certain value.

The memory controller 20 and the memory device 10 may be integrated into one semiconductor device. For example, the memory controller 20 and the memory device 10 may be integrated into one semiconductor device to form a memory card. For example, the memory controller 20 and the memory device 10 may be integrated into one semiconductor device to form a Personal Computer (PC) memory card, a CompactFlash (CF) card, a smart media (SM) card (SMC), a memory stick, a multi-media card (MMC) (MMC, reduced size MMC card (RS-MMC), multi-media card micro (MMCmicro)), a Secure Digital (SD) card (SD, mini SD, microSD), and a Universal Flash Storage (UFS), and the like. As another example, the memory controller 20 and the memory device 10 may be integrated in one semiconductor device to form a solid state disk/drive (SSD).

Figure 2:
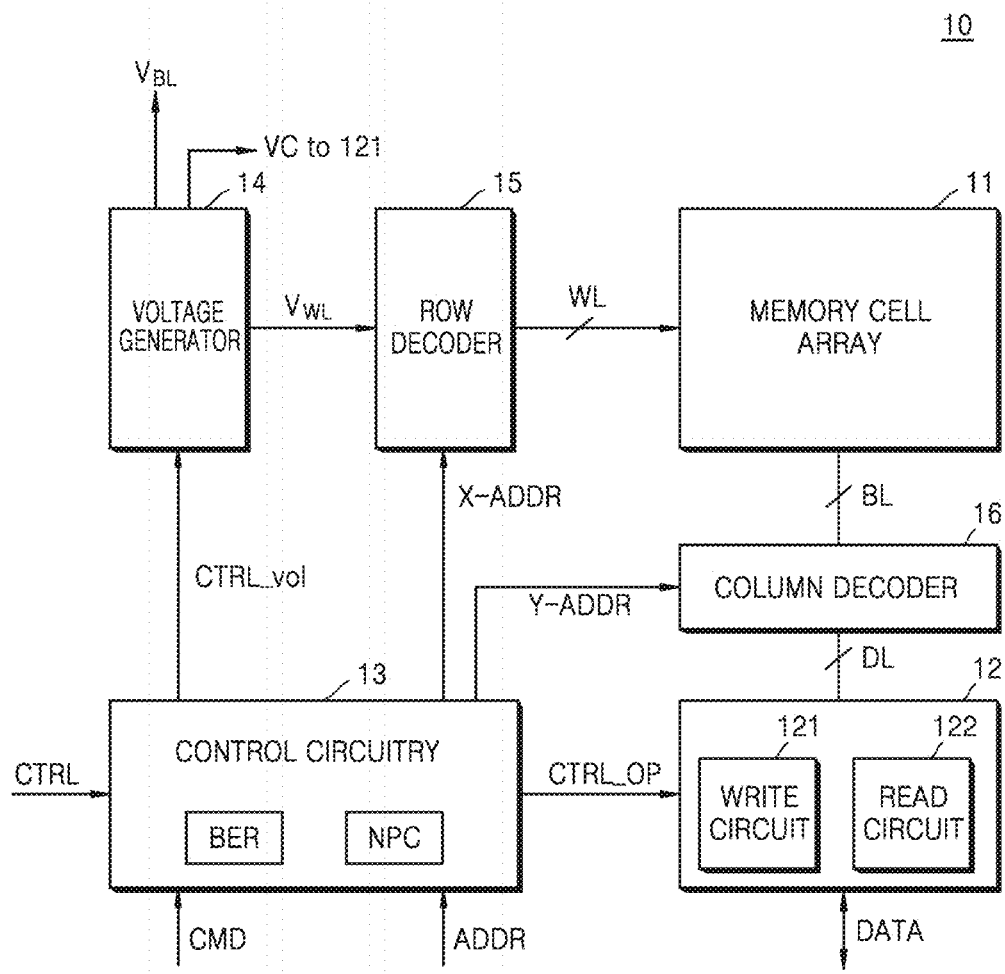
FIG. 2 is a block diagram for describing a memory device included in the memory system shown in FIG. 1.

FIG. 2 is a block diagram for describing the memory device 10 included in the memory system 1 shown in FIG. 1.

Referring to FIG. 2, the memory device 10 may include the memory cell array 11, the read/write circuit 12, the control circuit 13, a voltage generator 14, a row decoder 15, and a column decoder 16, and the write/read circuit 12 may include a write circuit 121 and a read circuit 122. The row decoder 15 may be referred to herein as a row decoder circuit. The column decoder 16 may be referred to herein as a column decoder circuit.

The memory cell array 11 may be connected to the plurality of first signal lines and the plurality of second signal lines and may include the plurality of memory cells that are respectively placed in the regions at which the plurality of first signal lines and the plurality of second signal lines cross one another. Hereinafter, some example embodiments of the inventive concepts will be described having a case in which the plurality of first signal lines are bit lines BL and the plurality of second signal lines are word lines WL as an example.

Figure 3:
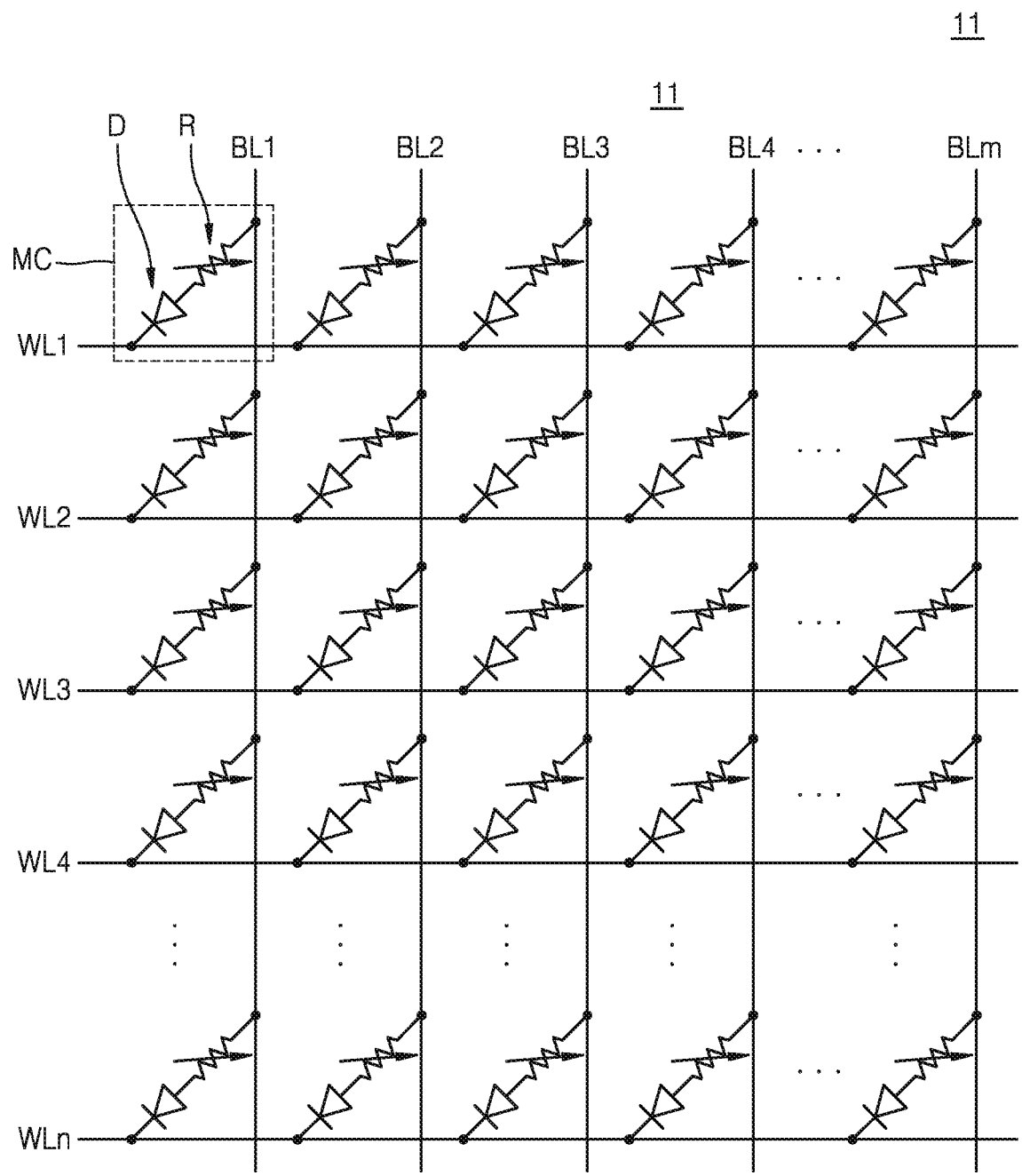
FIG. 3 is a circuit diagram for describing a memory cell array shown in FIG. 2 in detail.

As shown in FIG. 3, the memory cell array 11 may be a two-dimensional memory cell array having a horizontal structure and may include a plurality of word lines WL1 through WLn, a plurality of bit lines BL1 through BLm, and a plurality of memory cells MC. The memory cell array 11 may include a plurality of memory blocks. In each memory block, a plurality of memory cells may be arranged in rows and columns. Herein, the number of word lines WL, the number of bit lines BLs, and the number of memory cells MC may be variously modified according to some example embodiments. However, the inventive concepts are not limited thereto, and in some example embodiments, the memory cell array 11 may be a three-dimensional memory cell array having a vertical structure.

According to some example embodiments, each of the plurality of memory cells MC may include a variable resistance device R and a selection device D. Here, the variable resistance device R may be referred to as a variable resistance material, and the selection device D may be referred to as a switching device.

In some example embodiments, the variable resistance device R may be connected between one of the plurality of bit lines BL1 through BLm and the selection device D, and the selection device D may be connected between the variable resistance device R and one of the plurality of bit lines WL1 through WLn. However, the inventive concepts are not limited thereto, and the selection device D may be connected between one of the plurality of bit lines BL1 through BLm and the variable resistance device R, and the variable resistance device R may be connected between the selection device D and one of the plurality of word lines WL1 through WLn.

The selection device D may be connected between one of the plurality of word lines WL1 through WLn and the variable resistance device R and may, according to voltages applied to the word line and the bit line connected to the switching device D, control current supply to the variable resistance device R. Although the selection device D is shown as a diode in FIG. 3, it is merely an example embodiment of the inventive concepts, and in some example embodiments, the selection device D may be replaced by another device that may be switched.

Figure 4A:
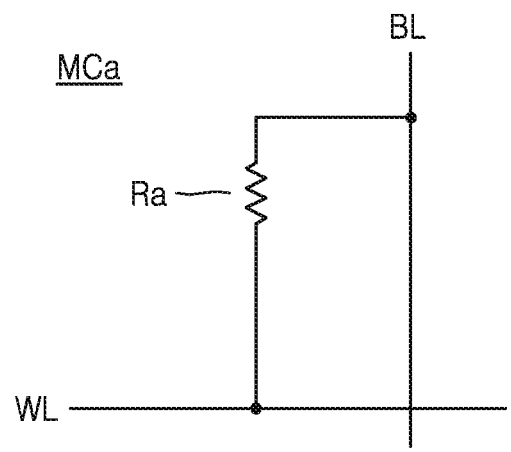
FIGS. 4A, 4B, 4C, and 4D are circuit diagrams respectively illustrating modified embodiments of the memory cell shown in FIG. 3.

Modifications of the memory cell MC may be implemented as it is shown in FIGS. 4A, 4B, 4C, and 4D. In FIG. 4A, a memory cell MCa may include a variable resistance device Ra which may be connected to a bit line BL and a word line WL. The memory cell MCa may store data by using voltages which are applied respectively to the bit line BL and the word line WL.

Figure 4B:
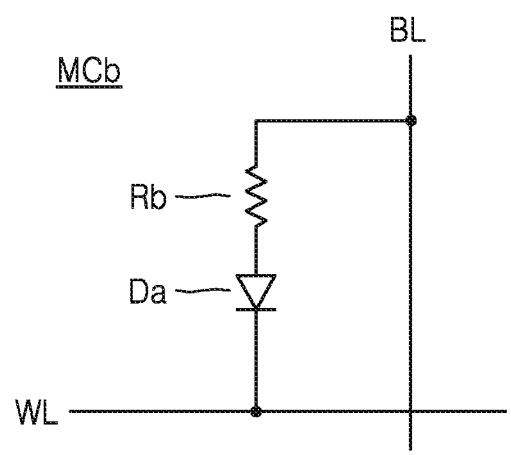

In FIG. 4B, a memory cell MCb may include a variable resistance device Rb and a unidirectional diode Da. The variable resistance device Rb may include a resistive material for storing data. The unidirectional diode Da may be a switching device, that is, a selection device that provides a current to/blocks a current flowing to the variable resistance device R according to biasing of a word line WL and a bit line BL. The unidirectional diode Da may be connected between the variable resistance device Rb and the word line WL, and the variable resistance device R may be connected between the bit line BL and the unidirectional diode Da. Positions of the unidirectional diode Da and the variable resistance device R may be changed with each other.

In some example embodiments, the unidirectional diode Da may be a PN junction diode or a PIN junction diode, an anode of the unidirectional diode Da may be connected to the variable resistance device Rb, and a cathode of the unidirectional diode Da may be connected to one of the plurality of word lines WL1 through WLn. In this case, when a voltage gap between the anode and the cathode of the unidirectional diode Da is greater than a threshold voltage, the unidirectional diode Da may be turned on and a current may be supplied to the variable resistance device Ra.

Figure 4C:
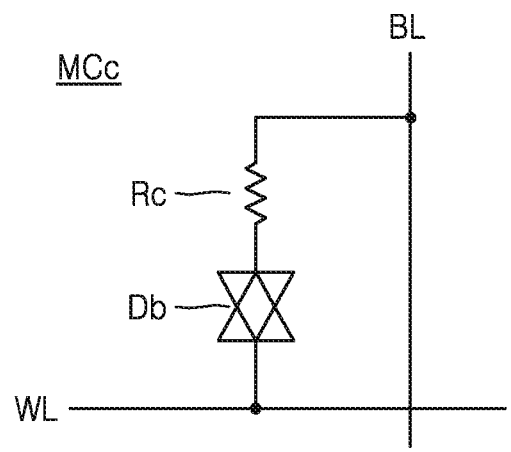

In FIG. 4C, a memory cell MCc may include a variable resistance device Rc and a bidirectional diode Db. The variable resistance device Rc may include a resistive material for storing data. The bidirectional diode Db is connected between the variable resistance device R and the word line WL, and the variable resistance device Rc may be connected between the bit line BL and the bidirectional diode Db. Positions of the bidirectional diode Db and the variable resistance device Rc may be changed with each other. A leakage current flowing in a non-selection resistive cell may be blocked by using the bidirectional diode Db.

Figure 4D:
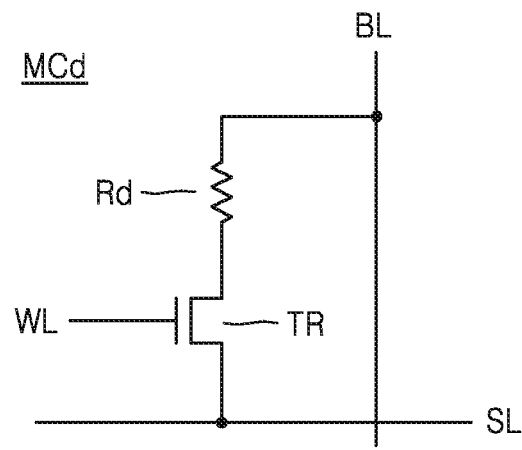

In FIG. 4D, a memory cell MCd may include a variable resistance device Rd and a transistor TR. The transistor TR may be a switching device, that is, a selection device that provides a current to/block a current flowing to the variable resistance device Rd according to a voltage of the word line WL. The transistor TR may be connected between the variable resistance device Rd and the word line WL, and the variable resistance device Rd may be connected between the bit line BL and the transistor TR. Positions of the transistor TR and the variable resistance device Rd may be changed with each other. The memory cell MCd may be selected or not selected according to on/off states of the transistor TR, which is driven by the word line WL.

Referring again to FIG. 2, the write circuit 121 may perform the program operation (that is, the write operation) by being connected to a selected bit line BL and providing a program current to a selected memory cell MC, and thus, data DATA that is to be stored in the memory cell array 11 may be input. Herein, the program current may be referred to as the write current.

When a write command is received from the memory controller 20, the write circuit 121 may perform the write operation on the memory cells MC. The write circuit 121 may perform a reset write operation to program the memory cells MC in a direction in which resistances of the memory cells MC increase. The write circuit 121 may also perform a set write operation to program the memory cells MC in a direction in which the resistances of the memory cells MC decrease.

In some example embodiments, the write circuit 121 may, according to write operation control by the control circuit 13, increase a reset write current to have a current level that is higher than a current level of a minimum reset write current that is needed for the memory cells to be into the HRS, and program the memory cells MC with reset data in the HRS state by providing the reset write voltage, which is increased, to the memory cells MC. Alternatively, the write circuit 121 may, according to the write operation control by the control circuit 13, increase a set write current to have a current level that is higher than a current level of a minimum set write current that is required for the memory cells MC to be changed into the LRS and program the memory cells with set data in the LRS state by providing the set write current, which is increased, to the memory cells MC.

The read circuit 122 may be connected to a bit line BL that is selected and read data DATA stored in a memory cell MC that is selected. The read circuit 122 may, when a read command is received from the memory controller 20, perform a read operation on the memory cell MC. The read circuit 122 may read data from each of the memory cells MC and provide a result of the reading to the control circuit 13.

The control circuit 13 may, based on the command CMD, the address ADDR, and the control signal CTRL which are received from the memory controller 20, output various control signals CTRL_OP and CTRL_VOL to write data DATA to the memory cell array 11 or read data DATA from the memory cell array 11. The control circuit 13 may provide operation control signals CTRL_OP to the write/read circuit 12. The operation control signals CTRL_OP may include a write enable signal WEN, a write control signal WCS, a read enable signal REN, a precharge signal PRE, a discharge signal DIS, and the like. In addition, the control circuit 13 may provide a voltage control signal CTRL_VOL to the voltage generator 14. In addition, the control circuit 13 may provide a row address X_ADDR to the row decoder 15 and provide a column address Y_ADDR to the column decoder 16.

The control circuit 13 may control the memory cells MC in a whole or partial region of the memory blocks within the memory cell array 11 to be repeatedly programmed with same data.

In some example embodiments, the control circuit 13 may control the memory cells MC in the memory block to be programmed with reset data and may store the number of reset data bits programmed in the memory block region. The control circuit 13 may compare the number of reset data bits, which are programmed, to the number of reset data bits read from the read circuit 122 and output a difference between the numbers of reset data bits, as BER, to the memory controller 20. The control circuit 13 may increase the reset write current to have a current level that is higher than the current level of the minimum reset write current that is required for the memory cells MC to be changed into a high resistance state (HRS) and may control the memory cells MC to be programmed by using the reset write current that is increased.

In some example embodiments, the control circuit 13 may control the memory cells in the memory block to be programmed with set data and store the number of set data bits programmed in the memory block region. The control circuit 13 may compare the number of set data bits, which are programmed, to the number of set data bits read from the read circuit 122 and output a gap between the numbers of set data bits, as BER, to the memory controller 20. The control circuit 13 may increase the set write current to have a current level that is higher than the current level of the minimum set write current that is required for the memory cells MC to be changed into a low resistance state and may control the memory cells MC to be programmed by using the set write current that is increased.

In some example embodiments, the control circuit 13 may count the number ("quantity") of program times of the reset data or the set data that is performed on the memory block and output the number of program times (NPC) to the memory controller 20.

The voltage generator 14 may, based on the voltage control signal CTRL_VOL, generate various kinds of voltages for performing the write operation and the read operation on the memory cell array 11. The voltage generator 14 may generate a first driving voltage VWL to drive the plurality of word lines WL and a second driving voltage VBL to drive the plurality of bit lines BL.

The voltage generator 14 may generate a control voltage VC to control a magnitude of the write current I supplied to the memory cells MC in the write operation. The voltage generator 14 may increase a magnitude of the control voltage VC in response to the voltage control signal CTRL_VOL. As the magnitude of the control voltage VC increases, the magnitude of the write current I supplied to the memory cells MC also increases.

The row decoder 15 may be connected to the memory cell array 11 via the plurality of word lines WL and activate the word line that is selected from among the plurality of word lines WL, in response to the row address X_ADDR that is received from the control circuit 13. The row decoder 15 may, in response to the row address X_ADDR, control a voltage applied to the selected word line among the plurality of word lines WL or control the connection relationship of the selected word lines.

The column decoder 16 may be connected to the memory cell array 11 through the plurality of bit lines BL and may, in response to the column address Y_ADDR that is received from the control circuit 13, activate selected bit lines among the plurality of bit lines BL. The column decoder 16, in response to the column address Y_ADDR, control a voltage applied to the selected bit lines among the plurality of bit lines BL or control the connection relationship of the selected bit lines.

Figure 5:
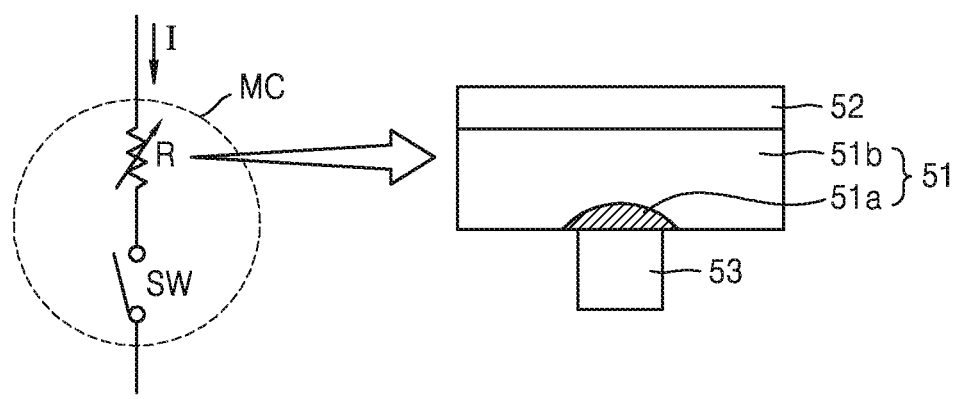
FIG. 5 shows an example of a variable resistance device included in the memory cell of FIG. 3.

FIG. 5 shows an example of a variable resistance device included in the memory cell MC shown in FIG. 3.

Referring to FIG. 5, the memory cell MC may include a variable resistance device R and a switching device SW. The switching device SW may be implemented by using various devices such as a transistor, and a diode. The variable resistance device R may, as it is enlarged and described with reference to FIG. 5, include a phase change layer 51 including a compound of germanium (Ge), antimony (Sb), and tellurium (Te), an upper electrode 52 formed on the phase change layer 51, and a lower electrode 53 formed under the phase change layer 51.

The upper electrode 52 and the lower electrode 53 may include various kinds of metals, metal oxides, or metal nitrides. The upper electrode 52 and the lower electrode 53 may include aluminum (Al), copper (Cu), titanium nitride (TiN), titanium-aluminum nitride (TixAlyNz), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chromium (Cr), antimony (Sb), iron (Fe), molybdenum (Mo), palladium (Pd), tin (Sn), zirconium (Zr), zinc (Zn), iridium dioxide (IrO2), strontium zirconate oxide (StZrO3), and the like. The phase change layer 51 may be formed from a bipolar resistance memory material or a unipolar resistance memory material. The bipolar resistance memory material may be programmed into a set state or a reset state due to a polarity of a current, and Perovskite-based materials may be used for the bipolar resistance memory material. Meanwhile, the unipolar resistance memory material may be programmed into a set state or a reset state due to a current that is unipolar, and transition metal oxides such as NiOX or TiOx may be used for the unipolar resistance memory material.

The GST material may be programmed between an amorphous state having a relatively high resistivity and a crystalline state having a relatively low resistivity. The GST material may be programmed by heating the GST material. The intensity and a period of time of heating may be used for determining whether the GST material remains in the amorphous state or the crystalline state. A high resistivity and a low resistivity may each be indicated as logic "0" or logic "1", which are programmed values, and may be detected by measuring the resistivity of the GST material. On the contrary, a high resistivity and a low resistivity may each be indicated as logic "1" or logic "0", which are programmed values.

In FIG. 5, when the write current I is applied to the memory cell MC, the write current I that is applied to the memory cell MC flows through the lower electrode 53. When the write current I is applied to the memory cell MC for a very short period of time, only a layer adjacent to the lower electrode 53 is heated by Joule's heat. In this case, due to differences between heating profiles, a limited part of the phase change layer 51 (the hatched part 51a in FIG. 5) becomes the crystalline state (e.g., the set state) or the amorphous state (e.g., the reset state), while a remainder part 51b of the phase change layer 51 may refrain from entering the crystalline state or the amorphous state. In some example embodiments, the remainder part 51b of the phase change film 51 may enter the crystalline state (e.g., a set state) or the amorphous state (e.g., a reset state) like the hatched part 51a of the phase change film 51.

Figure 6:
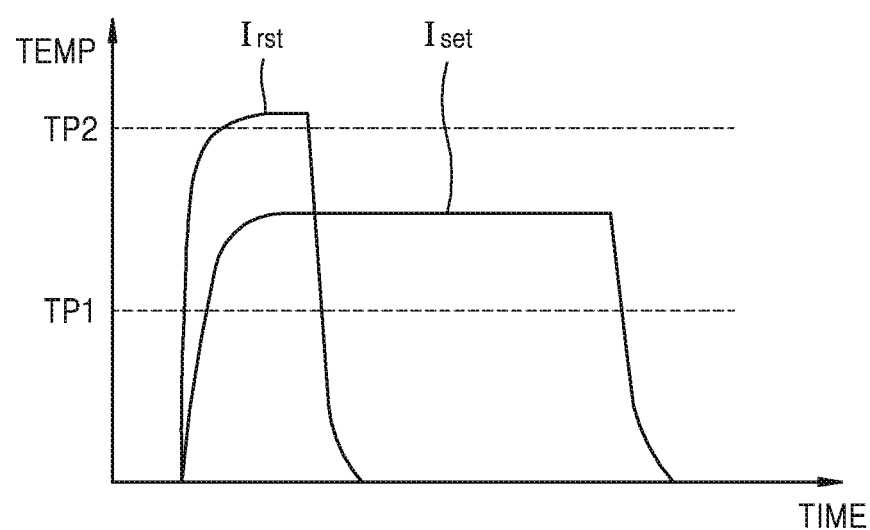
FIG. 6 is a graph illustrating a write current that is applied to the memory cell shown in FIG. 5.

FIG. 6 is a graph illustrating write currents applied to the memory cell MC shown in FIG. 5.

Referring to FIG. 6, to make the phase change layer 51 be in the amorphous state (e.g., the reset state), a high reset write current Irst is applied to the memory cell MC for a short period of time and then is removed. To make the phase change layer 51 be in the crystalline state (e.g., the set state), a set write current Iset that is lower than the reset write current Irst is applied to the memory cell MC, and the set write current Iset that is applied to the memory cell MC is maintained for a period of time for crystallization of the phase change layer 51 and then is removed. According to the method that is described above, the memory cell MC may be set to be in one of the crystalline state and the amorphous state. In this case, TP1 indicates a crystallization temperature of the phase change layer 51 and TP2 indicates a melting point of the phase change layer 51.

Figure 7A:
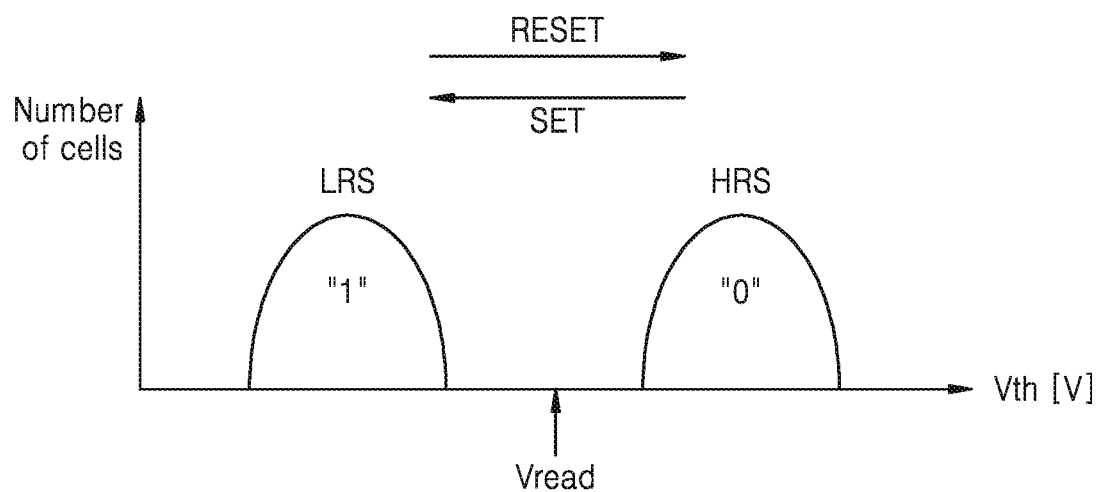
FIGS. 7A, 7B, and 7C are graphs respectively used for describing characteristics of memory cells when the memory cell shown in FIG. 5 is a single-level cell.
Figure 7B:
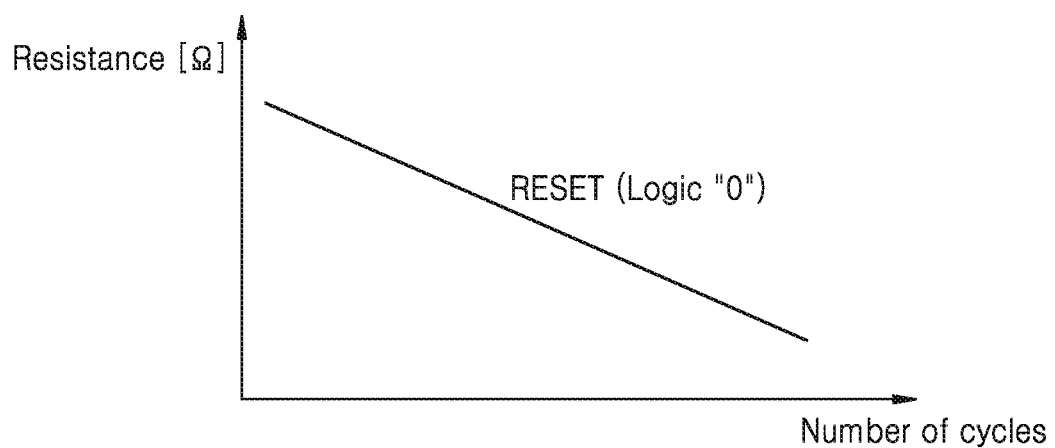
Figure 7C:
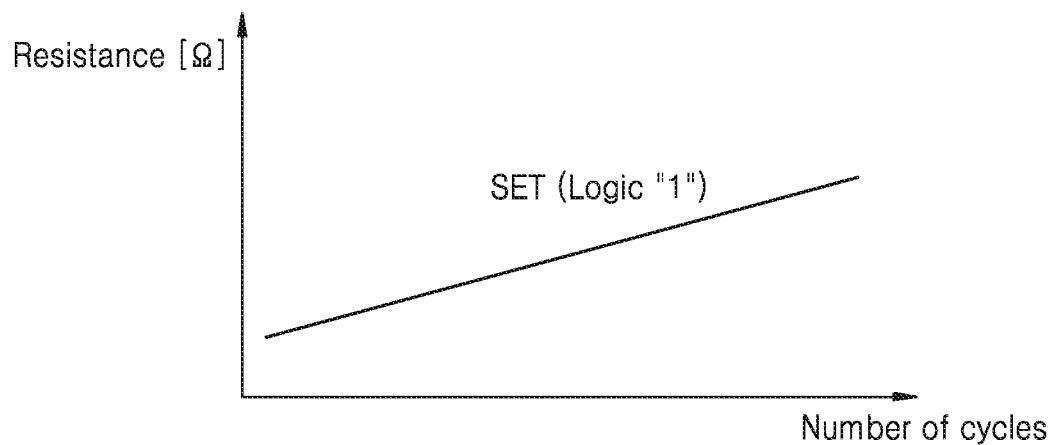

FIGS. 7A, 7B, and 7C are graphs respectively used for describing characteristics of the memory cells MC when the memory cell MC shown in FIG. 5 is a single-level cell (SLC).

FIG. 7A illustrates an ideal threshold voltage distribution of SLCs, in which the memory cells are programmed with 1 bit. In FIG. 7A, the horizontal axis indicates a threshold voltage and the vertical axis indicates the number of memory cells.

The variable resistance device R of the memory cell MC may be in a low-resistance state (LRS) or a high-resistance state (HRS). An operation of switching the variable resistance device R from the HRS to the LRS by applying the write current to the memory cell MC is referred to as a set operation or a set write operation. An operation of switching the variable resistance device R from the LRS to the HRS by applying the write current to the memory cell MC is referred to as a reset operation or a reset write operation.

A certain voltage between a distribution according to the LRS and a distribution according to the HRS may be set as a read voltage Vread. In a read operation with respect to the memory cell MC, a read result that is equal to or greater than the read voltage Vread may be determined to be reset data (logic "0") in the HRS, and a read result that is equal to or less than the read voltage Vread may be determined to be set data (logic "1") in the LRS. When the memory cell MC is repeatedly programmed with the reset data (logic "0") or the set data (logic "1"), as shown in FIGS. 7B and 7C, a resistance characteristic of the memory cell MC may be degraded.

FIG. 7B is an example of the characteristic of the memory cell MC that is repeatedly programmed with the reset data of logic "0" due to a high current that is applied to the memory cell MC. In FIG. 7B, the horizontal axis indicates the number of program cycles and the vertical axis indicates resistance. In the beginning, as resistivity of the memory cell MC behaves, the phase change layer 51 has a high resistance. However, when the memory cell MC is continuously programmed with the reset data of logic "0" without intervening programming with the set data of logic "1", the resistance of the memory cell MC may decrease. Accordingly, a sensing margin between the set data of logic "1" and the reset data of logic "0" decreases, and as a result, sensing of the reset data of logic becomes uncertain, slower, or generally, less reliable. Accordingly, the resistive memory device may have timing overhead and/or decrease in reliability.

FIG. 7C shows that degradation that occurred to the reset data of logic "0" may also occur to the set data of logic "1". When the memory cell MC is continuously programmed with the set data of logic "1" without an arbitrarily intervening programming with the reset data of logic "0", the resistance of the memory cell MC may increase as a function for the number of program cycles. The increase in resistivity of the reset data of logic "1" decreases the sensing margin between the set data of logic "1" and the reset data of logic "0" and may also decrease reliability of the resistive memory device.

Figure 8:
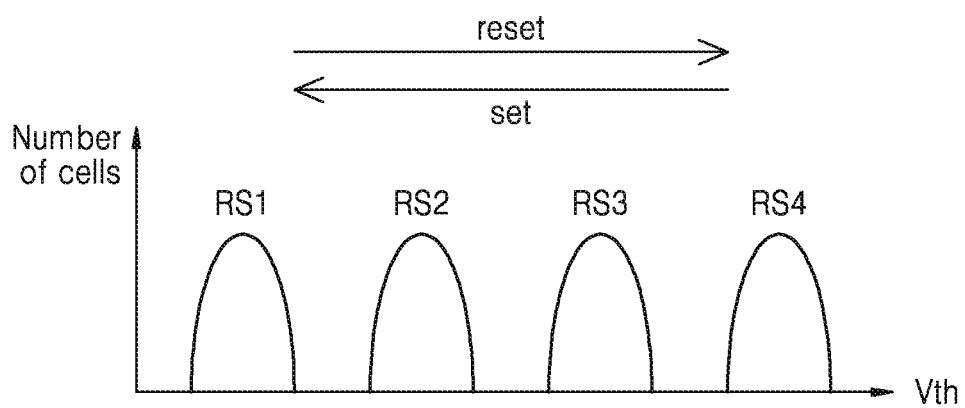
FIG. 8 is a graph illustrating a distribution of the memory cells according to resistances when the memory cell shown in FIG. 5 is a multi-level cell.

FIG. 8 is a graph showing a distribution of the memory cells MC according to resistances when the memory cell MC shown in FIG. 5 is a multi-level cell. In FIG. 8, the horizontal axis indicates a threshold voltage Vth and the vertical axis indicates the number of memory cells MC.

Referring to FIG. 8, when the memory cell MC is a multi-level cell which is programmed with 2-bit data, the memory cell MC may have one of a first resistance state RS1, a second resistance state RS2, a third resistance state RS3, and a fourth resistance state RS4. In some example embodiments, the memory device 10 may be controlled to program the memory cells MC of the memory cell array 11 to one or more resistance states of the first to fourth resistance states RS1 to RS4. The memory controller 20 may be configured to control the memory device 10 to program the memory cells MC of the memory cell array 11 to one or more resistance states of the first to fourth resistance states RS1 to RS4.

However, the inventive concepts are not limited thereto, and in some example embodiments, the plurality of memory cells may include triple level cells storing 3-bit data and may each have one of eight resistance states. In some example embodiments, the plurality of memory cells may include memory cells that may each store at least 4-bit data.

Compared to SLCs, a gap between resistance distributions in MLCs is narrow, and accordingly, in MLCs, read errors may occur due to a small change in a threshold voltage. Accordingly, to secure a read margin, the resistance states RS1, RS2, RS3, and RS4 may have threshold voltage ranges that do not overlap one another.

Each of the resistance states RS1, RS2, RS3, and R4 may correspond to one of data '00', data '01', data '10', and data '11'. In some example embodiments, a resistance level may increase in order of data '11', data '01', data '00', and data '10'. In other words, the first resistance state RS1 may correspond to data '11', the second resistance state RS2 may correspond to data '01', the third resistance state RS3 may correspond to data '00', and the fourth resistance state RS4 may correspond to data '10'.

Figure 9:
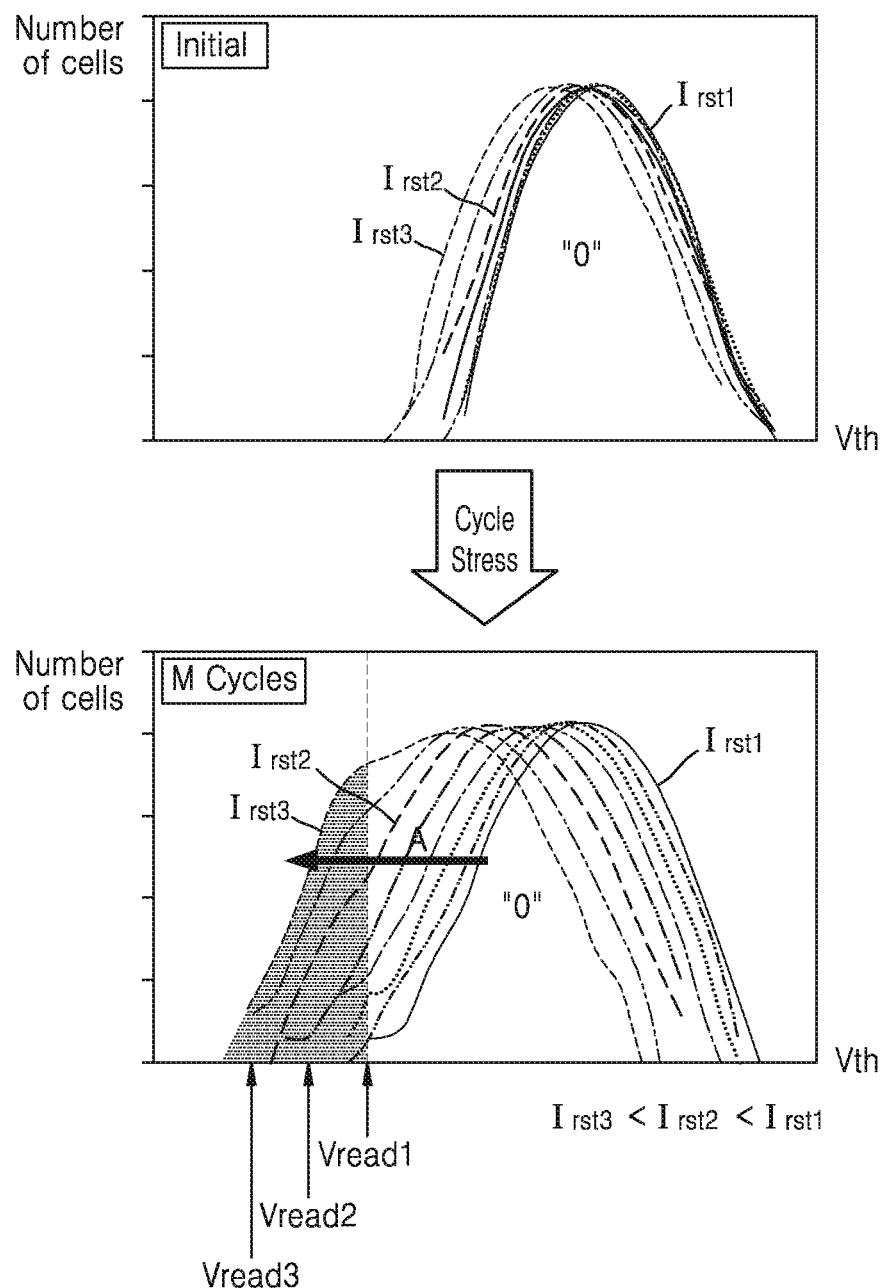
FIG. 9 is a diagram for explaining threshold voltage distributions of the memory cells of FIG. 7A in a reset data state.

FIG. 9 is a diagram for explaining threshold voltage distributions of the memory cells of FIG. 7A in a reset data state.

FIG. 9 shows change in a threshold voltage distribution of the reset data according to program operations after performing the program operations by applying a plurality of reset write currents Irst1, Irst2, and Irst3 to the memory cell MC. In the beginning of the program operations, threshold voltage distributions of the reset data of the memory cells MC programmed in response to the plurality of reset write currents Irst1, Irst2, and Irst3 have shapes that are approximately identical to one another. Next, when the NPC increases to about M times, shapes of the threshold voltage distributions are changed to have greater widths (A).

For example, it is assumed that a highest current among the plurality of reset write current Irst1, Irst2, and Irst3 is a first reset write current Irst1 and a lowest current is a third reset write current Irst3. Due to stress caused by programming M times, a threshold voltage distribution of the reset data of the memory cells MC programmed by using the third reset write current Irst3 may move to the left, that is, toward the LRS of the set data, and is significantly widened.

In reading data from the memory cells MC, when the memory cells MC programmed by using the third reset write current Irst3 are read by using a first read voltage Vread1, the memory cells in a hatched region, although the memory cells are programmed with the reset data, may be determined as being programmed with the set data due to decrease in a threshold voltage. That is, the number of memory cells included in the hatched region is represented as BER, and the BER is high in the hatched region. It may be expected that the BER of the reset data according to the third reset write current Irst3 may increase according to an increase in the NPC.

According to some example embodiments, the BER of the reset data may vary according to a level of the read voltage. In some example embodiments, the BER may be determined according to a level of a read voltage that is used for a read operation on the memory cells. For example, a read direction at the first read voltage Vread1, a second read voltage Vread2, and the third read voltage Vread3 may be set in a direction in which a voltage level increases from the third read voltage Vread3 to the first read voltage Vread1. Accordingly, the BER according to the first read voltage Vread1, the second read voltage Vread2, and the third read voltage Vread3 may increase.

Here, the BER of the reset data according to the third reset write current Irst3 that is the lowest reset read current may be reduced when a current level of the third reset write current Irst3 may be increased. Furthermore, the BER of the reset data of the memory cells MC may be reduced when the memory cells MC are programmed by using a reset write current which has a current level that is higher than the current level of the minimum reset write current required for the phase change layer 51 of the memory cell MC to cause phase change into the reset data.

Figure 10:
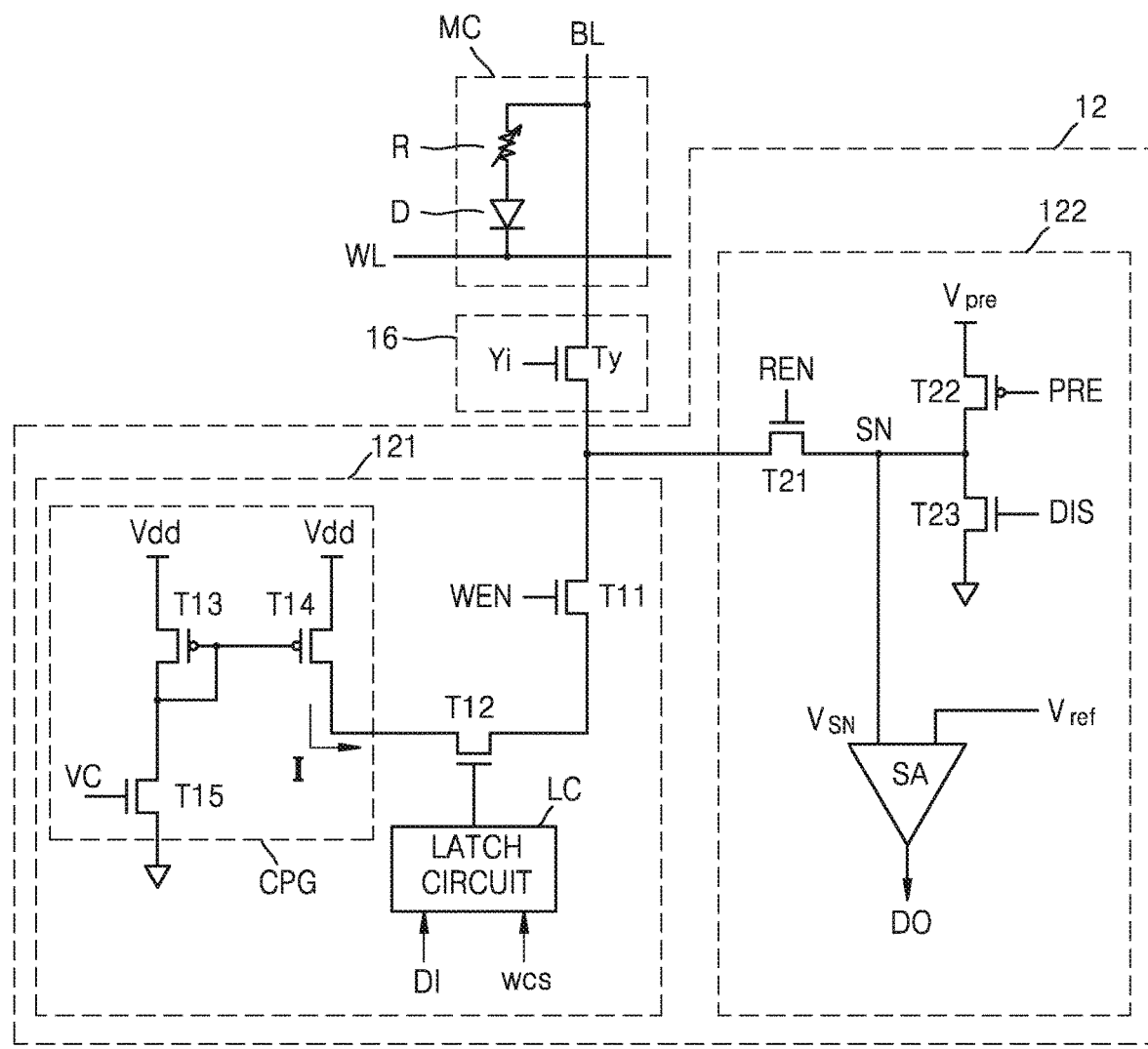
FIG. 10 is a circuit diagram for describing a write circuit of a memory device according to some example embodiments of the inventive concepts.

FIG. 10 is a circuit diagram of a write circuit of a memory device according to some example embodiments of the inventive concepts.

Referring to FIG. 10, the memory cell MC may be placed in a region at which the bit line BL and the word line WL cross each other and may include the variable resistance device R and the selection device D. The column decoder 16 may include a bit line selection transistor Ty, and the bit line selection transistor Ty may connect the memory cell MC to the write/read circuit 12 in response to a column selection signal Yi. Hereinafter, some example embodiments in which the column selection signal Yi is activated and the memory cell MC and the write/read circuit 12 are connected to each other will be described.

The write circuit 121 may provide a write current I to program the memory cell MC. The write circuit 121 may include a first transistor T11, a second transistor T12, a current pulse generator CPG, and a latch circuit LC. When the write enable signal WEN is activated, the first transistor T11 is turned on, and the write circuit 121 may be connected to the memory cell MC.

The current generator CPG may include a third transistor T13, a fourth transistor T14, and a fifth transistor T15. The third transistor T13 and the fourth transistor T14 may each be connected to a power voltage Vdd and may collectively form a current mirror, and the fifth transistor T15 that is connected between the third transistor T13 and the fourth transistor T14 may provide the write current I to the memory cell MC in response to a control voltage VC that is applied to a gate of the fifth transistor T15. As a magnitude of the control voltage VC increases, the magnitude of the write current I that is provided to the memory cell MC may also increase. As shown in FIG. 10, the write circuit 121 may be configured to provide the write current I via the fourth transistor T14.

Figure 11:
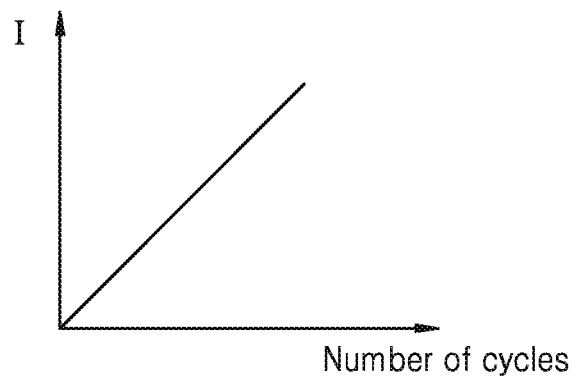
FIG. 11 is a graph for describing a write current according to the number of program operations on memory cells, according to some example embodiments of the inventive concepts.

The write current I may, as shown in FIG. 11, be set to have a magnitude that increases according to an increase in the NPC of the memory cells. The magnitude ("current level") of the write current I may be changed by the control voltage VC. The control voltage VC may be generated in the voltage generator 14 in response to the voltage control signal CTRL_VOL (see FIG. 2) that is generated in response to the control signal CTRL of the memory controller 20 (see FIG. 1). As the magnitude of the control voltage VC increases, the magnitude of the write current I provided to the memory cell MC also increases.

In some example embodiments, when the memory cells MC are SLCs shown in FIG. 7A, as the magnitude of the write current I is changed, the memory cells MC may be switched into one of the HRS and the LRS. The magnitude of the write current I may be increased to be greater than a magnitude of the minimum reset write current that is required for the memory cells MC to be changed from the LRS to the HRS. Alternatively, the magnitude of the write current I may be increase to be greater than a magnitude of the minimum set write current that is required for the memory cells MC to be changed from the HRS to the LRS.

In some example embodiments, when the memory cells MC are MLCs shown in FIG. 8, as the magnitude of the write current I is changed, the memory cells MC may be switched from the first resistance state RS1 to one of the second resistance state RS2, the third resistance state RS3, and the fourth resistance state RS4 such that a resistance level of the memory cells MC increases. In addition, the memory cells MC may be switched from the second resistance state RS2 to the third resistance state RS3 or the fourth resistance state RS4. Furthermore, the memory cells MC may be switched from the third resistance state RS3 to the fourth resistance state RS4.

For example, when a first write current is applied to the memory cells MC, the memory cells MC may be switched from the first resistance state RS1 to the second resistance state RS2. A magnitude of the first write current may increase to have a greater value than a magnitude of a minimum reset write current that is required for the memory cells to be changed from the first resistance state RS1 to the second resistance state RS2. When a second write current is applied to the memory cells MC, the memory cells MC may be switched from the first resistance state RS1 to the third resistance state RS3. A magnitude of the second write current may increase to have a greater value than a magnitude of a minimum reset write current that is required for the memory cells to be changed from the first resistance state RS1 to the third resistance state RS3. Furthermore, when a third write current is applied to the memory cells MC, the memory cells MC may be switched from the first resistance state RS1 to the fourth resistance state RS4. A magnitude of the third write current may be increased to have a greater value than a magnitude of a minimum reset write current that is required for the memory cells to be changed from the first resistance state RS1 to the fourth resistance state RS4.

As the magnitude of the write current I is changed, the memory cells MC may be switched from the fourth resistance state RS4 to one of the first resistance state RS1, the second resistance state RS2, and the third resistance state RS3 such that the resistance level of the memory cells MC decreases. In addition, the memory cells MC may be switched from the third resistance state RS3 to the first resistance state RS1 or the second resistance state RS2. Furthermore, the memory cells MC may be switched from the second resistance state RS2 to the first resistance state RS1.

For example, when the first write current is applied to the memory cells MC, the memory cells MC may be switched from the fourth resistance state RS4 to the first resistance state RS'. The magnitude of the first write current may be decreased to have a greater value than a magnitude of a minimum set write current that is required for the memory cells to be changed from the fourth resistance state RS4 to the first resistance state RS1. In addition, when the second write current is applied to the memory cells MC, the memory cells MC may be switched from the fourth resistance state RS4 to the second resistance state RS2. The magnitude of the second write current may be increased to have a greater value than a magnitude of a minimum set write current that is required for the memory cells to be changed from the fourth resistance state RS4 to the second resistance state RS2. Furthermore, when the third write current is applied to the memory cells MC, the memory cells MC may be switched from the fourth resistance state RS4 to the third resistance state RS3. The magnitude of the third write current may be increased to have a greater value than a magnitude of a minimal set write current that is required for the memory cells to be changed from the fourth resistance state RS4 to the third resistance state RS3.

The latch circuit LC may, in response to the write control signal WCS, output a gate voltage such that the second transistor T12 may be selectively turned on according to a logic level of the input data DI. The input data DI is data that is derived from the data DATA provided by the memory controller 20.

In some example embodiments, when the write control signal WCS instructs a write operation in a reset direction, the latch circuit LC may turn on the second transistor T12 according to a logic level '0' of the input data DI and turn off the second transistor T12 when the logic level of the input data is '1'.

In some example embodiments, when the write control signal WCS instructs a write operation in a set direction, the latch circuit LC may turn off the second transistor T12 when the logic level of the input data DI is '0' and turn on the second transistor T12 when the logic level of the input data DI is '1'.

The read circuit 122 may read data that is stored in the memory cell MC. The read circuit 122 may include a first transistor T21, a second transistor T22, a third transistor T23, and a sense amplifier (SA). When the read enable signal REN is activated, the first transistor T21 is turned on, and the read circuit 122 may be connected to the memory cell MC.

When the precharge signal PRE is activated, the second transistor T12 may be turned on and the bit line BL may be precharged to the precharge voltage Vpre. Meanwhile, when the discharge signal DIS is activated, the third transistor T13 may be turned on and the bit line BL may be discharged to a ground voltage.

The sense amplifier SA, which is activated in response to a sense enable signal SEN, may compare the voltage VSN of the sensing node SN to the reference voltage Vref and output the output data DO that indicates whether the memory cell MC is turned on or turned off. The reference voltage Vref may be set as the read voltages Vread1 through Vread3 (see FIG. 9). The output data DO may be provided as data DATA to outside of the memory device 10, for example, to the memory controller 20.

Figure 12:
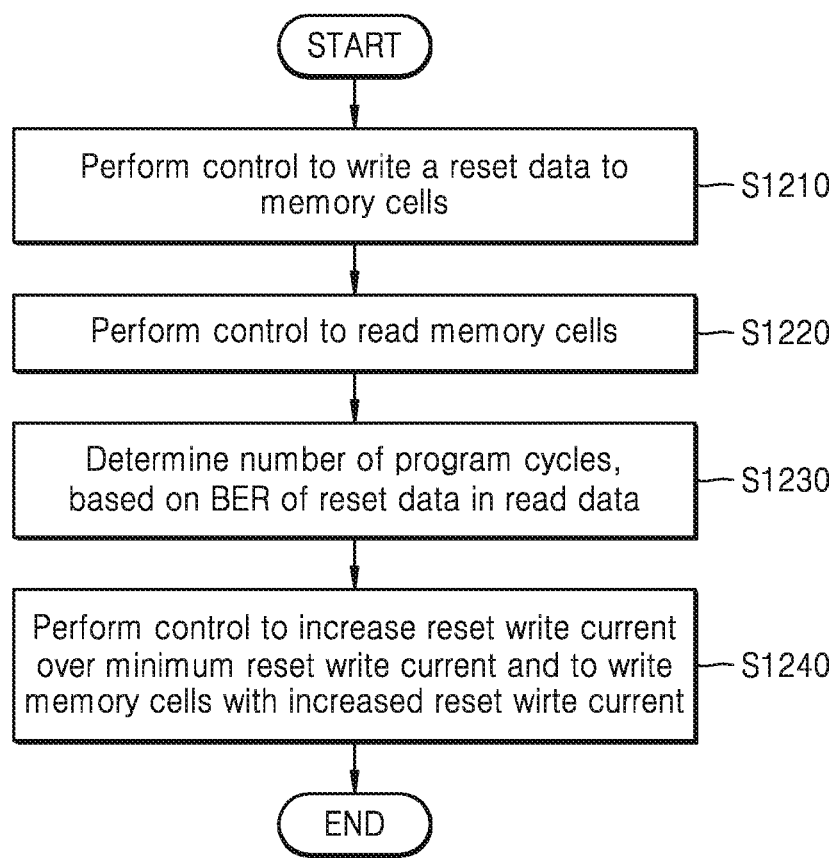
FIG. 12 is a flowchart describing a method of compensating for degradation of a memory device by using a memory controller, according to some example embodiments.

FIG. 12 is a flowchart describing a method of compensating for degradation of a memory device by using the memory controller 20, according to some example embodiments.

Referring to FIG. 12 in association with FIGS. 1, 2, 9, and 10, in operation S1210, the memory controller 20 may control the memory cells MC in the memory device 10 to be programmed with the reset data.

Under write operation control of the memory controller 20, the memory device 10 may perform a reset data write operation. The write circuit 121 may perform the reset data write operation. As it is described with reference to FIG. 8, the write circuit 121 may, for example, apply the reset write currents Irst1, Irst2, and Irst3 to the memory cells MC, thereby programming the memory cells MC with the reset data. The control circuit 13 may program the memory cells in a whole or partial region of the memory blocks in the memory cell array 11 with the reset data. In this case, the control circuit 13 may store the number of reset data bits programmed in the memory block region. The control circuit 13 may store the determined number of memory cells that are programmed into the resistance state in the write operation. The number of memory cells so programmed may be the same as the number of reset data bits programmed in the memory block region. The controlling at S1210 may include controlling the memory device 10 to program the memory cells MC in all or some of the memory blocks in the memory cell array 11 to a resistance state. The resistance state may be one resistance state of a plurality of resistance states. In some example embodiments, the resistance state may be a first resistance state RS1. In some example embodiments, the resistance state may be a fourth resistance state RS4. In some example embodiments, the resistance state is a high resistance state (HRS) of a plurality of resistance states (e.g., resistance states RS1 to RS4). The programming may include repeatedly programming the memory cells MC to the resistance state.

In operation S1220, the memory controller 20 may control the memory cells in the memory device 10 to be read. The controlling at operation S1220 may include controlling the memory device 10 to perform a read operation on the memory cells, where the memory cells may have been already programmed into a resistance state at operation S1210.

Under read operation control of the memory controller 20, the memory device 10 may perform a reset data read operation. The read circuit 122 may perform the reset data read operation. The read circuit 122 may read the memory cells, which are programmed in response to the reset write currents Irst1, Irst2, and Irst3, by using a voltage level of the reference voltage Vref or a voltage level of the read voltage Vread.

In operation S1230, the memory controller 20 may check the NPC based on a BER of the read data that is provided by the memory device 10. The memory device 10 (e.g., the control circuit 13) may control the memory cells MC of the memory block in the memory cell array 11 to be programmed with the reset data and store the number of bits of the reset data programmed in a region of the memory block. The memory device 10 (e.g., the control circuit 13) may compare the number of reset data bits, which is programmed, to the number of reset data bits output via the read circuit 122 and may output a gap between the number of reset data bits, which is programmed, and the number of reset data bits, as a BER, to the memory controller 20. The memory device 10 (e.g., the control circuit 13) may compare a determined number of memory cells in the resistance state that were read in the read operation at operation S1220 to a determined number of memory cells that were programmed into the resistance state at operation S1210. The memory device 10 (e.g., the control circuit 13) may output a gap between the determined number of memory cells in the resistance state at operation S1220 and the determined number of memory cells that are programmed into the resistance state at operation S1210 as the BER. According to some example embodiments, the control circuit 13 may count the number ("quantity") of program operations performed in the memory cell array 11, for example the number of program operations on the memory cells in the resistance state and may provide ("output") the number to an outside of the memory device 10, for example to the memory controller 20. The memory controller 20 may receive one or more indicators that indicate the degree of degradation of the memory cells of the memory device 10, such that the memory controller 20 may sense the degree of degradation of one or more memory cells of the memory device 10. Such one or more indicators may include data regarding the BER, the number of on-cells, and/or the number of off-cells. For example, the memory controller 20 may check the NPC of the memory device 10 corresponding to the BER to sense the degree of degradation of the memory device 10. In some example embodiments, the memory controller 20 may receive an indicator that indicates a quantity of program operations on the memory cells corresponding to bit error rates (BER) occurring in the read operation on the memory cells at operation S1220. In some example embodiments, the memory controller 20 may receive an indicator that indicates a quantity of program operations to program the memory cells into the resistance state at operation S1210. According to some example embodiments, the memory controller 20 may check the NPC of the reset data provided by the control circuit 13 of the memory device 10 to sense the degree of degradation of the memory device 10. Configurations of detecting a degree of degradation of the memory device 10, which may be a resistive memory device, are described in detail in U.S. application Ser. No. 16/377,420, filed Apr. 8, 2019 and published as U.S. Pub. No. 2020/0051628 on Feb. 13, 2020, the entire contents of which are herein incorporated by reference in their entirety.

In operation S1240, the memory controller 20 may increase the magnitude of the write current I such that the reset write current Irst increases according to the NPC that is checked in operation S1230 and may program the memory cells by using the write current I that is increased. Accordingly, the memory controller 20 may, based on the indicator that indicates the degree of degradation, control one or more memory cells of the memory device 10 to be programmed into the resistance state to which the memory cell(s) were programmed at operation S1210, based on using a write current that has a current level greater than a current level of a minimum write current that is necessary for the memory cell(s) to be programmed into the resistance state. For example, where the resistance state in question is the HRS, the magnitude ("current level") of the write current I may be increased to be greater than the magnitude ("current level") of the minimum reset write current that is required ("necessary") for the memory cells to be changed from the LRS to the HRS. In some example embodiments, operation S1240 may include the memory controller 20 providing a control signal to the control circuit 13 of the memory device 10 based on the determined BER, which may cause the control circuit 13 to, in response, control a control voltage VC to change the write current I to be increased in current level to have a current level that is greater than a current level of a minimum write current necessary for the memory cells of the memory device 10 to be changed to the resistance state. The control circuit 13 may, for example control a control voltage VC to change the write current I to be increased in current level to have a current level that is greater than a current level of a minimum reset write current necessary for the memory cells of the memory device 10 to be changed to the HRS.

In the method of compensating for degradation of the memory device 10 by using the memory controller 20, as the magnitude of the write current I is increased such that the reset write current Irst of the memory cells MC increases, the threshold voltage distributions of the reset data may be moved into the HRS. Accordingly, reset data sensing becomes more reliable and faster, and the timing overhead may be eliminated. Accordingly, the functioning of a computing device, electronic device, or the like that includes the memory controller 20 and the memory device 10 may be improved.

Figure 13:
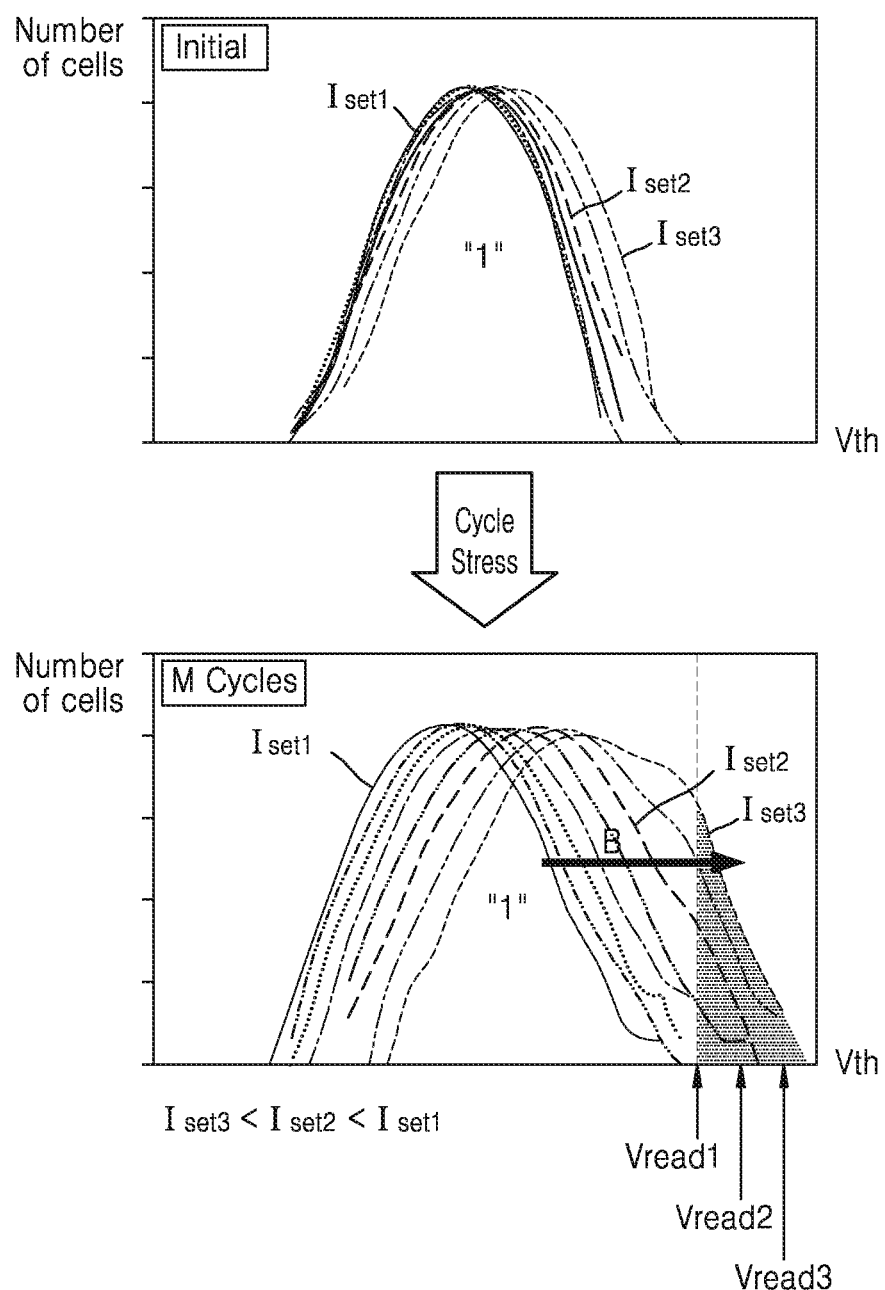
FIG. 13 is a diagram for explaining threshold voltage distributions of the memory cells of FIG. 7A in a set data state.

FIG. 13 is a diagram for explaining threshold voltage distributions of the memory cells of FIG. 7A in a set data state.

FIG. 13 shows change in threshold voltage distributions of the set data according to program operations after performing the program operations by applying the plurality of set write currents Iset1, Iset2, and Iset3 to the memory cell MC. In the beginning of the program operations, threshold voltage distributions of the reset data of the memory cells MC programmed in response to the plurality of reset write currents Iset1, Iset2, and Iset3 have shapes that are approximately identical to one another. Next, when the NPC increases to about M times, shapes of the threshold voltage distributions are changed to have greater widths (B).

For example, it is assumed that a highest current among the plurality of set write currents Iset1, Iset2, Iset3 is a first set write current Iset1 and a lowest current is a third set write current Iset3. Due to stress caused by M times of program, a threshold voltage of the set data of the memory cell MC programmed by using the third set write current Iset3 may move to the right, that is, to the HRS of the reset data, and is significantly widened.

In reading of the memory cells MC, when the memory cells MC programmed by using the third set write current Iset3 are read by using the read voltage Vread, the memory cells in a hatched region, although the memory cells are programmed with set data, may be determined as being programmed with the reset data due to decrease in a threshold voltage. In other words, it is presumable that BER of the memory cells in a hatched region is high and BER of the set data according to the third set write current Iset3 may increase as the NPC increases.

According to some example embodiments, the BER of the reset data may vary according to a level of the read voltage. For example, a read direction at the first read voltage Vread1, the second read voltage Vread2, and the third read voltage Vread3 may be set in a direction in which a voltage level decreases from the third read voltage Vread3 to the first read voltage Vread1. Accordingly, the BER according to the first read voltage Vread1, the second read voltage Vread2, and the third read voltage Vread3 may increase. Thus, the BER may be determined according to a level of a read voltage that is used for the read operation on the memory cells at operation S1220.

Here, the BER of the set data according to the third set write current Iset3 that is the lowest set write current may be reduced when a current level of the third set write current Iset3 may be increased. In addition, BER of the set data of the memory cells MC may be reduced when the memory cells MC are programmed by using a current that is greater than the minimum reset write current that is required for the phase change layer 51 of the memory cell MC to cause phase change into the set state.

Figure 14:
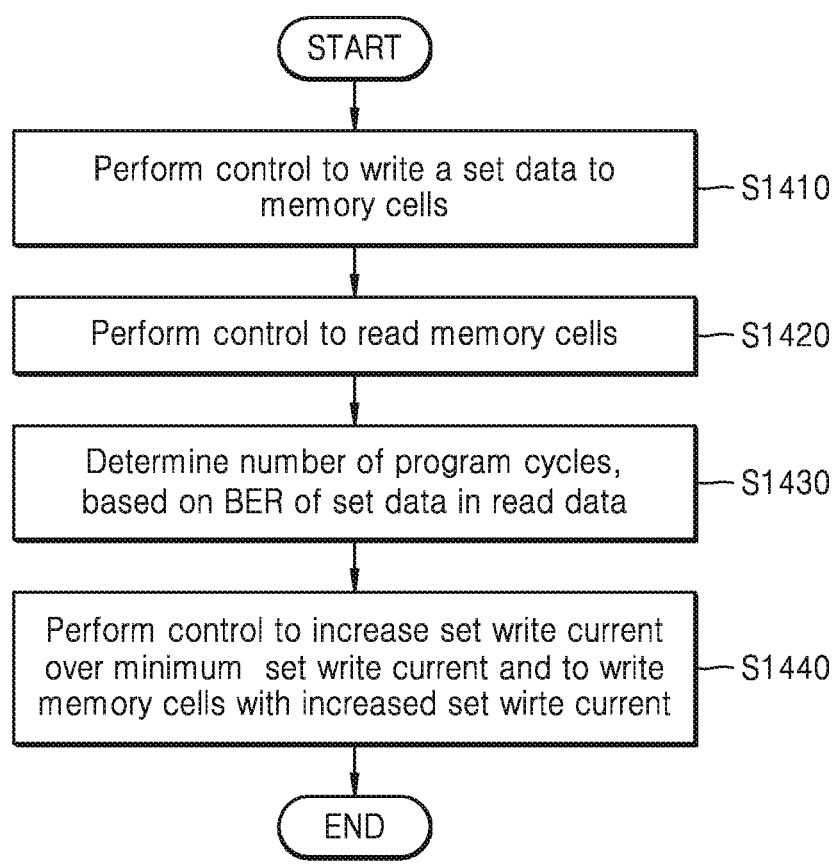
FIG. 14 is a flowchart describing a method of compensating for degradation of a memory device by using a memory controller, according to some example embodiments.

FIG. 14 is a flowchart describing a method of compensating for degradation of the memory device 10 by using the memory controller 20, according to some example embodiments.

Referring to FIG. 14 in association with FIGS. 1, 2, 10, and 13, in operation S1410, the memory controller 20 may control the memory cells MC in the memory device 10 to be programmed with the set data.

Under write operation control by the memory controller 20, the memory device 10 may perform a set data write operation. The write circuit 121 may perform the set data write operation. As it is described with reference to FIG. 13, the write circuit 121 may, for example, apply reset write currents Iset1, Iset2, and Iset3 to the memory cells MC, thereby programming the memory cells MC with the reset data. The control circuit 13 may program set data in the memory cells in a whole or partial region of the memory blocks in the memory cell array 11. In this case, the control circuit 13 may store the number of set data bits programmed in the memory block region. The control circuit 13 may store the determined number of memory cells that are programmed into the resistance state in the write operation. The determined number of memory cells so programmed may be the same as the number of set data bits programmed in the memory block region. The controlling at S1410 may include controlling the memory device 10 to program the memory cells MC in all or some of the memory blocks in the memory cell array 11 to a resistance state. The resistance state may be one resistance state of a plurality of resistance states. In some example embodiments, the resistance state may be a first resistance state RS1. In some example embodiments, the resistance state may be a fourth resistance state RS4. In some example embodiments, the resistance state is a low resistance state (LRS) of a plurality of resistance states (e.g., resistance states RS1 to RS4). The programming may include repeatedly programming the memory cells MC to the resistance state.

In operation S1420, the memory controller 20 may control the memory cells MC in the memory device 10 to be read. The controlling at operation S1420 may include controlling the memory device 10 to perform a read operation on the memory cells, where the memory cells may have been already programmed into a resistance state at operation S1410.

Under read operation control of the memory controller 20, the memory device 10 may perform a set data read operation. The read circuit 122 may perform the set data read operation. The read circuit 122 may read the memory cells, which are programmed in response to the set write currents Iset1, Iset2, and Iset3, by using a voltage level of the reference voltage Vref or a voltage level of the read voltage Vread.

In operation S1430, the memory controller 20 may check the NPC based on a BER of the read data that is provided by the memory device 10. The memory device 10 (e.g., the control circuit 13) may control the memory cells MC of the memory block in the memory cell array 11 to be programmed with the set data and store the number of set data bits programmed in the memory block region. The memory device 10 (e.g., the control circuit 13) may compare the number of bits of set data, which is programmed, to the number of bits of set data output via the read circuit 122 and may output a gap between the number of reset data bits, which is programmed, and the number of reset data bits, to the memory controller 20 as a BER. The memory device 10 (e.g., the control circuit 13) may compare the determined number of memory cells in the resistance state read in the read operation at operation S1420 to the determined number of memory cells that are programmed into the resistance state at operation S1410. The memory device 10 (e.g., the control circuit 13) may output a gap between the determined number of memory cells in the resistance state at operation S1420 and the determined number of memory cells that are programmed into the resistance state at operation S1410 as the BER. According to some example embodiments, the control circuit 13 may count the number ("quantity") of program operations performed in the memory cell array 11, for example the number of program operations on the memory cells in the resistance state and may provide ("output") the number to an outside of the memory device 10, for example to the memory controller 20. The memory controller 20 may receive one or more indicators that indicate the degree of degradation of the memory cells of the memory device 10, such that the memory controller 20 may sense the degree of degradation of one or more memory cells of the memory device 10. Such one or more indicators may include data regarding the BER, the number of on-cells, and/or the number of off-cells. For example, the memory controller 20 may check the NPC of the memory device 10 corresponding to the BER to sense the degree of degradation of the memory device 10. In some example embodiments, the memory controller 20 may receive an indicator that indicates a quantity of program operations on the memory cells corresponding to bit error rates (BER) occurring in the read operation on the memory cells at operation S1420. In some example embodiments, the memory controller 20 may receive an indicator that indicates a quantity of program operations to program the memory cells into the resistance state at operation S1410. Configurations of detecting a degree of degradation of the memory device 10, which may be a resistive memory device, are described in detail in U.S. application Ser. No. 16/377,420, filed Apr. 8, 2019 and published as U.S. Pub. No. 2020/0051628 on Feb. 13, 2020, the entire contents of which are herein incorporated by reference in their entirety.

According to some example embodiments, the memory controller 20 may check the NPC of the reset data provided by the control circuit 13 of the memory device to sense the degree of degradation of the memory device 10.

In operation S1440, the memory controller 20 may increase the magnitude of the write current I such that the set write current Iset increases according to the NPC that is checked in operation S1430 and may program the memory cells by using the write current I that is increased. Accordingly, the memory controller 20 may, based on the indicator that indicates the degree of degradation, control one or more memory cells of the memory device 10 to be programmed into the resistance state to which the memory cell(s) were programmed at operation S1410, based on using a write current that has a current level greater than a current level of a minimum write current that is necessary for the memory cell(s) to be programmed into the resistance state. For example, where the resistance state in question is the LRS, the magnitude ("current level") of the write current I may be increased to be greater than the magnitude ("current level") of the minimum set write current that is required for the memory cells MC to be changed from the HRS to the LRS. In some example embodiments, operation S1440 may include the memory controller 20 providing a control signal to the control circuit 13 of the memory device 10 based on the determined BER, which may cause the control circuit 13 to, in response, control a control voltage VC to change the write current I to be increased in current level to have a current level that is greater than a current level of a minimum write current necessary for the memory cells of the memory device 10 to be changed to the resistance state. The control circuit 13 may, for example control a control voltage VC to change the write current I to be increased in current level to have a current level that is greater than a current level of a minimum set write current necessary for the memory cells of the memory device 10 to be changed to the LRS.

In the method of compensating for degradation of the memory device 10 by using the memory controller 20, as the magnitude of the write current I is increased such that the set write current Iset of the memory cells MC increases, the threshold voltage distributions of the set data may be moved into the LRS. Accordingly, set data sensing becomes more reliable and faster, and the timing overhead may be eliminated. Accordingly, the functioning of a computing device, electronic device, or the like that includes the memory controller 20 and the memory device 10 may be improved.

Figure 15:
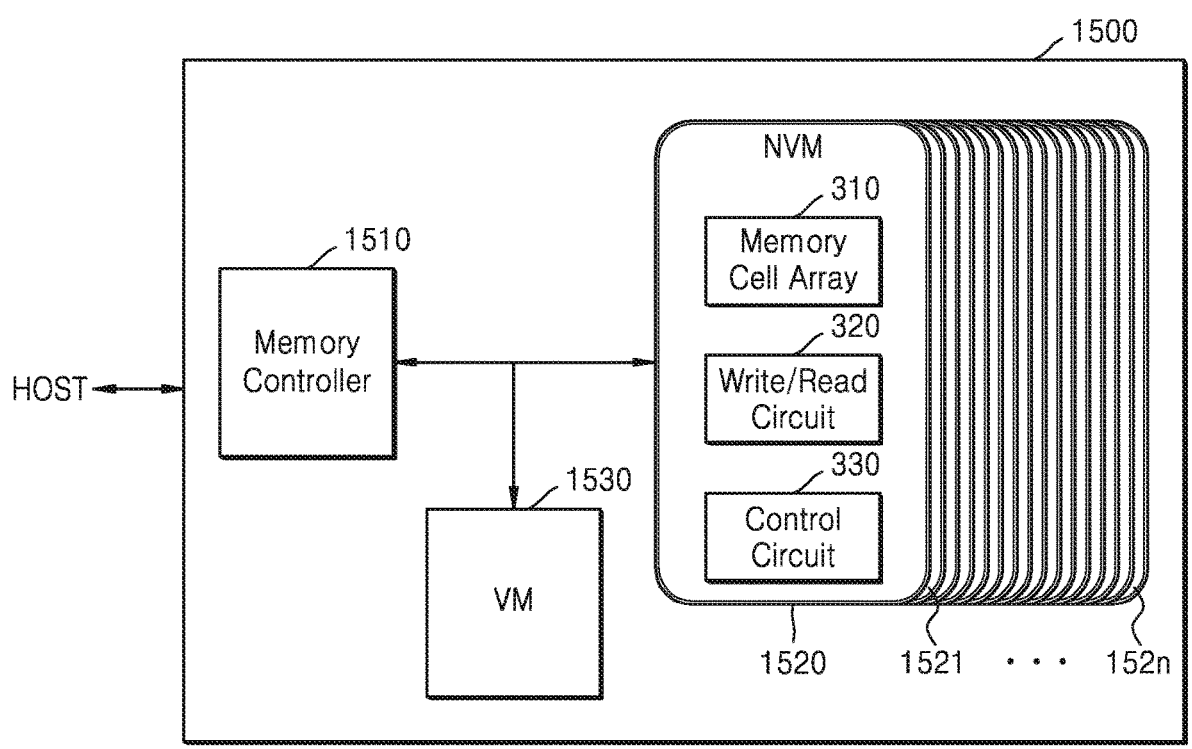
FIG. 15 is a block diagram schematically illustrating a configuration of a memory system that employs a method of compensating for degradation of a memory device by using a memory controller, according to some example embodiments of the inventive concepts.

FIG. 15 is a block diagram schematically showing a configuration of a memory system that employs a method of compensating for degradation of a memory device by using a memory controller, according to some example embodiments of the inventive concepts. Such a memory system 1500 may be referred to herein as a computing device, an electronic device, or the like.

Referring to FIG. 15, a memory system 1500 may include a memory controller 1510, a plurality of non-volatile memory devices 1520 through 152n, and a volatile memory device 1530. The memory controller 1510 may, in response to a request from a host connected to the memory system 1500, control a write operation and/or a read operation of the plurality of non-volatile memory devices 1520 through 152n.

According to some example embodiments, the host may be an arbitrary computing system such as a personal computer (PC), a server computer, a workstation, a laptop, a mobile phone, a smart-phone, a personal digital assistant (PDA), a portable multimedia player (PMP), a digital camera, a digital television (TV), a set-top box, a music player, a portable game console, and a navigation system.

The plurality of non-volatile memory devices 1520 through 152n are used as a storage medium of the memory system 1500. Each of the non-volatile memory devices 1520 through 152n may, for example, be a resistive memory device. The plurality of non-volatile memory devices 1520 through 152n may be connected to the memory controller 1510 via a channel. Each of the non-volatile memory devices 1520 through 152n may, in response to requests from the host that is provided via the channel, perform the write operation and/or the read operation.

The volatile memory device 1530 may temporarily store write data provided from the host or read data provided from the non-volatile memory devices 1520 through 152n (including non-volatile memory device 1521 where n is greater than zero). The volatile memory device 1530 may store meta data or cache data to be stored in the non-volatile memory devices 1520 through 152n. DRAM, SRAM, and the like may be included in the volatile memory device 1530.

Each of the non-volatile memory devices 1520 through 152n may be a resistive memory device corresponding to the memory device 10 described with reference to FIGS. 1 through 14. Each of the non-volatile memory devices 1520 through 152n may include a memory cell array 310 including a plurality of memory cells, a write/read circuit 320 that programs the memory cells into a first resistance state by using a write current according to a control voltage and read data from the programmed memory cells, and a control circuit 330 that counts BERs of the memory cells occurring in the read operation and outputs the BERs to the memory controller 1510. The control circuit 330 may, in response to a control signal received from the memory controller 1510 based on BER, provide the control voltage such that the write current I has a magnitude that is greater than the magnitude of the minimum write current required for the memory cells to be changed into the first resistance state.

The memory controller 1510 may compensate for degradation with respect to each of the non-volatile memory devices 1520 through 152n. The memory controller 1510 may perform following operations: controlling each of the non-volatile memory devices 1520 through 152n to program memory cells into the first resistance state; controlling the memory device to read data from the programmed memory cells into the first resistance state; receiving BER of the memory cells, which occur in the read operation, from each of the non-volatile memory devices 1520 through 152n; determining the NPC of the memory cells corresponding to the BER; and controlling, based on the NPC that is determined, the memory cells in the non-volatile memory devices 1520 through 152n to be programmed into the first resistance state, by using a write current that is greater than a minimum write current that is required for the memory cells to be changed into the first resistance state.

Figure 16:
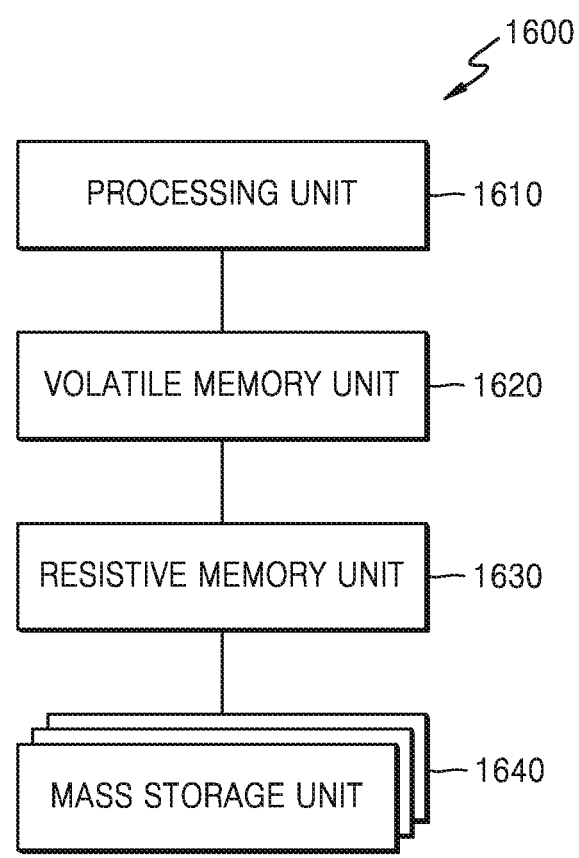
FIG. 16 is a block diagram illustrating a system to which a method of preventing degradation of the memory device, according to some example embodiments of the inventive concepts.

FIG. 16 is a block diagram illustrating a system 1600 to which a method of compensating for degradation of the memory device by using the memory controller may be applied. The system 1600 may be referred to herein as a computing device, an electronic device, or the like.

Referring to FIG. 16, the system 1600 may include a processing unit 1610 (also referred to herein as a processor, an instance of processing circuitry, or the like), a volatile memory unit 1620 (also referred to herein as a memory, a memory device, a storage device, or the like), a resistive memory unit 1630 (also referred to herein as a resistive memory device, a resistive storage device, a memory device, or the like), and a mass storage unit 1640 (also referred to herein as a mass storage device). The system 1600 may a computer system for general purposes or special purposes, such as a mobile device, a personal computer, a server computer, programmable home appliances, a main frame computer.

Functional units described in some example embodiments, in terms of implementation independence, may be classified as modules. For example, the module may be implemented in a custom very-large-scale integration (VLSI) circuit or a hardware circuit including a ready-made semiconductor such as gate array, a logic chip, a transistor, or another discrete component. The module may be implemented as a programmable hardware device, for example, a programmable gate array, a programmable gate logic, a programmable gate device, and the like. In addition, the module may be implemented in software configured a code, an object, a procedure, or a function that are executable.

The processing unit 1610 may execute an operation system and a plurality of software systems and perform particular calculations or tasks. The processing unit 1610 may be a micro-processor or a central processing unit (CPU).

The volatile memory unit 1620 is a medium that temporarily or occasionally stores data, as an operational memory or a cache memory of the system 1600. The volatile memory unit 1620 may include at least one memory device, for example, dynamic random access memory (DRAM).

The resistive memory unit 1630 may be used as a cache of the mass storage unit 1640. Part of data of an application or an operation system that is frequently accessed may be stored in the resistive memory unit 1630. The resistive memory unit 1630 may include at least one memory device, for example, PRAM. As access to the resistive memory unit 1630 is faster than in a case when the data is accessed via the mass storage unit 1640, for example, HDD, the resistive memory unit 1630 may be useful as a cache. The resistive memory unit 1630 may be implemented by using the example embodiments shown in FIGS. 1 through 14.

The resistive memory unit 1630 may include: a memory cell array including a plurality of memory cells; a write circuit configured to perform a write operation to program the memory cells into the first resistance state by using a write current according to a control voltage; a read circuit configured to perform a read operation to read data from the memory cells that are programmed into the first resistance state; and a control circuit configured to count BER of the memory cells, which occurs in the read operation, and output the BER to the memory controller. The control circuit may, in response to a control signal received from the memory controller 1510 based on BER, provide the control voltage such that the write current is greater than the minimum write current that is required for the memory cells to be changed into the first resistance state.

The mass storage unit 1640 may implemented in hard disk drive (HDD), solid state drive (SDD), a peripheral component interconnect express (PCIe) memory module, non-volatile memory express (NVMe), and the like. Optionally, one or more tiers in the mass storage unit 1640 may be implemented in one or more network-accessible devices and/or services, for example, a plurality of clients, a plurality of servers, NVMe-over Fabrics (NVMe-oF) and/or Remote Direct Memory Access (RDMA), a server farm(s), a server cluster(s), an application server(s), or a message server(s). The mass storage unit 1640 is a storage medium in which the system 1600 attempts to store user data for a long term. The mass storage unit 1640 may store an application program, program data, and the like.

While the inventive concepts have been particularly shown and described with reference to example embodiments thereof it will be understood by those of ordinary skill in the art that various changes in form and details may be made therein without departing from the spirit and scope as defined by the following claims.

What is claimed is:

1. A method of operating a memory controller, the memory controller configured to control a resistive memory device, the resistive memory device including a plurality of memory cells, the method comprising:
controlling the resistive memory device to program the plurality of memory cells into a first resistance state;
controlling the resistive memory device to perform a read operation on the plurality of memory cells that are programmed into the first resistance state;
receiving, from the resistive memory device, an indicator that indicates a degree of degradation of the plurality of memory cells; and
controlling, based on the indicator that indicates the degree of degradation, the plurality of memory cells to be programmed into the first resistance state based on using a write current that has a current level greater than a current level of a minimum write current that is necessary for the plurality of memory cells to be programmed into the first resistance state.

2. The method of claim 1, wherein
the indicator indicates a quantity of program operations on the plurality of memory cells corresponding to bit error rates (BER) occurring in the read operation on the plurality of memory cells.

3. The method of claim 2, wherein
the BER is determined according to a level of a read voltage that is used for the read operation on the plurality of memory cells.

4. The method of claim 1, wherein
the indicator indicates a quantity of program operations to program the plurality of memory cells into the first resistance state.

5. The method of claim 1, wherein
the plurality of memory cells include a plurality of single-level cells, and
the first resistance state is a high resistance state or a low resistance state.

6. The method of claim 5, wherein
the current level of the write current is greater than a current level of a minimum reset write current that is necessary for the plurality of memory cells to be changed into the high resistance state.

7. The method of claim 5, wherein
the current level of the write current is greater than a current level of a minimum set write current that is necessary for the plurality of memory cells to be changed into the low resistance state.

8. The method of claim 1, wherein
the plurality of memory cells include a plurality of multi-level cells, and
the first resistance state is one resistance state of a plurality of resistance states.

9. The method of claim 8, wherein
the first resistance state is a high resistance state of the plurality of resistance states, and
the current level of the write current is greater than a current level of a minimum reset write current that is necessary for the plurality of memory cells to be changed into the high resistance state.

10. The method of claim 8, wherein
the first resistance state is a low resistance state of the plurality of resistance states, and
the current level of the write current is greater than a current level of a minimum set write current that is necessary for the plurality of memory cells to be changed into the low resistance state.

11. A resistive memory device comprising:
a memory cell array including a plurality of memory cells;
a write circuit configured to perform a write operation, by using a write current according to a control voltage, to program the plurality of memory cells into a first resistance state;
a read circuit configured to perform a read operation to read data from the plurality of memory cells that are programmed into the first resistance state; and
a control circuit configured to count bit error rates (BER) of the plurality of memory cells that occur in the read operation and output the BER to an outside of the resistive memory device,
wherein the control circuit is configured to, in response to a control signal that is received from the outside of the resistive memory device based on the BER, control the control voltage such that the write current is increased to have a current level that is greater than a current level of a minimum write current necessary for the plurality of memory cells to be changed into the first resistance state.

12. The resistive memory device of claim 11, wherein
the control circuit is configured to output a quantity of program operations on the plurality of memory cells in the first resistance state to the outside of the resistive memory device.

13. The resistive memory device of claim 11, wherein
the BER is determined according to a level of a read voltage that is used for the read operation.

14. The resistive memory device of claim 11, wherein
the control circuit is configured to
store a determined quantity of memory cells that are programmed into the first resistance state in the write operation,
compare a determined quantity of memory cells in the first resistance state read in the read operation to the quantity of memory cells that are programmed into the first resistance state, and output a gap between the quantity of memory cells in the first resistance state and the quantity of memory cells that are programmed into the first resistance state as the BER.

15. The resistive memory device of claim 11, wherein the plurality of memory cells are single-level cells, and the first resistance state is a high resistance state or a low resistance state.

16. The resistive memory device of claim 15, wherein the control circuit is configured to control the control voltage such that the current level of the write current is increased to a current level that is greater than a current level of a minimum reset write current that is necessary for the plurality of memory cells to be changed into the high resistance state.

17. The resistive memory device of claim 15, wherein the control circuit is configured to control the control voltage such that the current level of the write current is increased to a current level that is higher than a current level of a minimum set write current that is necessary for the plurality of memory cells to be changed into the low resistance state.

18. The resistive memory device of claim 11, wherein the plurality of memory cells are multi-level cells, and the first resistance state is one resistance state of a plurality of resistance states.

19. The resistive memory device of claim 18, wherein the first resistance state is a high resistance state of the plurality of resistance states, and the control circuit is further configured to control the control voltage such that the current level of the write current is increased to a current level that is greater than a current level of a minimum reset write current that is necessary for the plurality of memory cells to be changed into the high resistance state.

20. The resistive memory device of claim 18, wherein the first resistance state is a low resistance state of the plurality of resistance states, and the control circuit is further configured to control the control voltage such that the current level of the write current is increased to a current level that is greater than a current level of a minimum reset write current that is necessary for the plurality of memory cells to be changed into the low resistance state.

21. The resistive memory device of claim 11, wherein the write circuit includes a first transistor and a second transistor which are each connected to a power voltage and collectively form a current mirror;

a third transistor that is connected between the first transistor and a ground transistor and includes a gate to which the control voltage is connected, and the write circuit is further configured to provide the write current via the second transistor.

22. A memory system, comprising:

a resistive memory device, the resistive memory device including a memory cell array including a plurality of memory cells;

a write circuit configured to perform a write operation, by using a write current according to a control voltage, to program the plurality of memory cells into a first resistance state;

a read circuit configured to perform a read operation to read data from the plurality of memory cells that are programmed into the first resistance state; and a control circuit configured to count bit error rates (BER) of the plurality of memory cells that occur in the read operation and output the BER; and a memory controller configured to control the resistive memory device, wherein the control circuit of the resistive memory device is configured to output the BER to the memory controller, wherein the memory controller is configured to determine a quantity of program operations on the plurality of memory cells corresponding to the BER, and control, based on the quantity of program operations on the plurality of memory cells that is determined, the write operation such that the write current is increased to have a current level that is greater than a current level of a minimum write current necessary for the plurality of memory cells to be changed into the first resistance state.

23. The memory system of claim 22, wherein the control circuit is configured to output the quantity of program operations on the plurality of memory cells to program the plurality of memory cells into the first resistance state to an outside of the resistive memory device.

24. The memory system of claim 22, wherein the BER is determined according to a level of a read voltage that is used for the read operation.

25. The memory system of claim 22, wherein the control circuit is configured to store a determined quantity of memory cells that are programmed into the first resistance state in the write operation, compare a determined quantity of memory cells in the first resistance state read in the read operation to the quantity of memory cells that are programmed into the first resistance state, and output a gap between the quantity of memory cells in the first resistance state and the quantity of memory cells that are programmed into the first resistance state as the BER.

26. The memory system of claim 22, wherein the control circuit is configured to control the control voltage such that the current level of the write current is increased to a current level that is greater than a current level of a minimum reset write current that is necessary for the plurality of memory cells to be changed into a high resistance state.

27. The memory system of claim 22, wherein the control circuit is configured to control the control voltage such that the current level of the write current is increased to a current level that is greater than a current level of a minimum set write current that is necessary for the plurality of memory cells to be changed into a low resistance state.

* * * * *